United States Patent
Limanov et al.

(10) Patent No.: US 11,673,208 B2
(45) Date of Patent: Jun. 13, 2023

(54) FIBER LASER APPARATUS AND METHOD FOR PROCESSING WORKPIECE

(71) Applicant: IPG PHOTONICS CORPORATION, Oxford, MA (US)

(72) Inventors: Alexander Limanov, Nashua, NH (US); Michael Von Dadelszen, Manchester, NH (US); Joshua Schoenly, Nashua, NH (US); James Cordingley, Littleton, MA (US); Manuel Leonardo, San Francisco, CA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 676 days.

(21) Appl. No.: 16/635,877

(22) PCT Filed: Jul. 31, 2018

(86) PCT No.: PCT/US2018/044671
§ 371 (c)(1),
(2) Date: Jan. 31, 2020

(87) PCT Pub. No.: WO2019/028064
PCT Pub. Date: Feb. 7, 2019

(65) Prior Publication Data
US 2021/0008660 A1    Jan. 14, 2021

Related U.S. Application Data

(60) Provisional application No. 62/549,254, filed on Aug. 23, 2017, provisional application No. 62/539,182, filed on Jul. 31, 2017.

(51) Int. Cl.
*B23K 26/073*    (2006.01)
*B23K 26/082*    (2014.01)
(Continued)

(52) U.S. Cl.
CPC ........ *B23K 26/073* (2013.01); *B23K 26/0821* (2015.10); *B23K 26/352* (2015.10); *H01S 3/067* (2013.01)

(58) Field of Classification Search
CPC .............. B23K 26/073; B23K 26/0821; B23K 26/352; H01S 3/067; H01L 21/02422;
(Continued)

(56) References Cited

FOREIGN PATENT DOCUMENTS

| WO | WO-2017004280 A1 | * | 1/2017 | ....... H01L 21/02068 |
| WO | WO-2017120584 A1 | * | 7/2017 | ......... B23K 26/0006 |

* cited by examiner

*Primary Examiner* — Dana Ross
*Assistant Examiner* — James F Sims, III
(74) *Attorney, Agent, or Firm* — Yuri B. Kateshov, Esq.; Caroline J. Roush, Esq.

(57) ABSTRACT

A surface treating method and apparatus include operating a quasi-continuous wave fiber laser and pre-scan shaping the laser beam such that an instantaneous spot beam has predetermined geometrical dimensions, intensity profile, and power; operating a scanner at an optimal angular velocity and angular range to divide the pre-scan beam into a plurality of sub-beams deflected towards the surface being processed; guiding the sub-beams through a post-scan optical assembly to provide the spot beam with predetermined geometrical dimensions, power, and angular velocity and range, which are selected such that the instantaneous spot beam is dragged in a scan direction over a desired length at a desired scan velocity, which allow the treated surface to be exposed for a predetermined exposure duration and have a predetermined fluence distribution providing the treated surface with a quality comparable to that of the surface processed by an excimer laser or a burst-mode fiber laser.

22 Claims, 13 Drawing Sheets

(51) Int. Cl.
*B23K 26/352* (2014.01)
*H01S 3/067* (2006.01)
(58) Field of Classification Search
CPC ......... H01L 21/02532; H01L 21/02678; H01L 21/02691
See application file for complete search history.

Known

Column Processing and Positive Heating Feedback

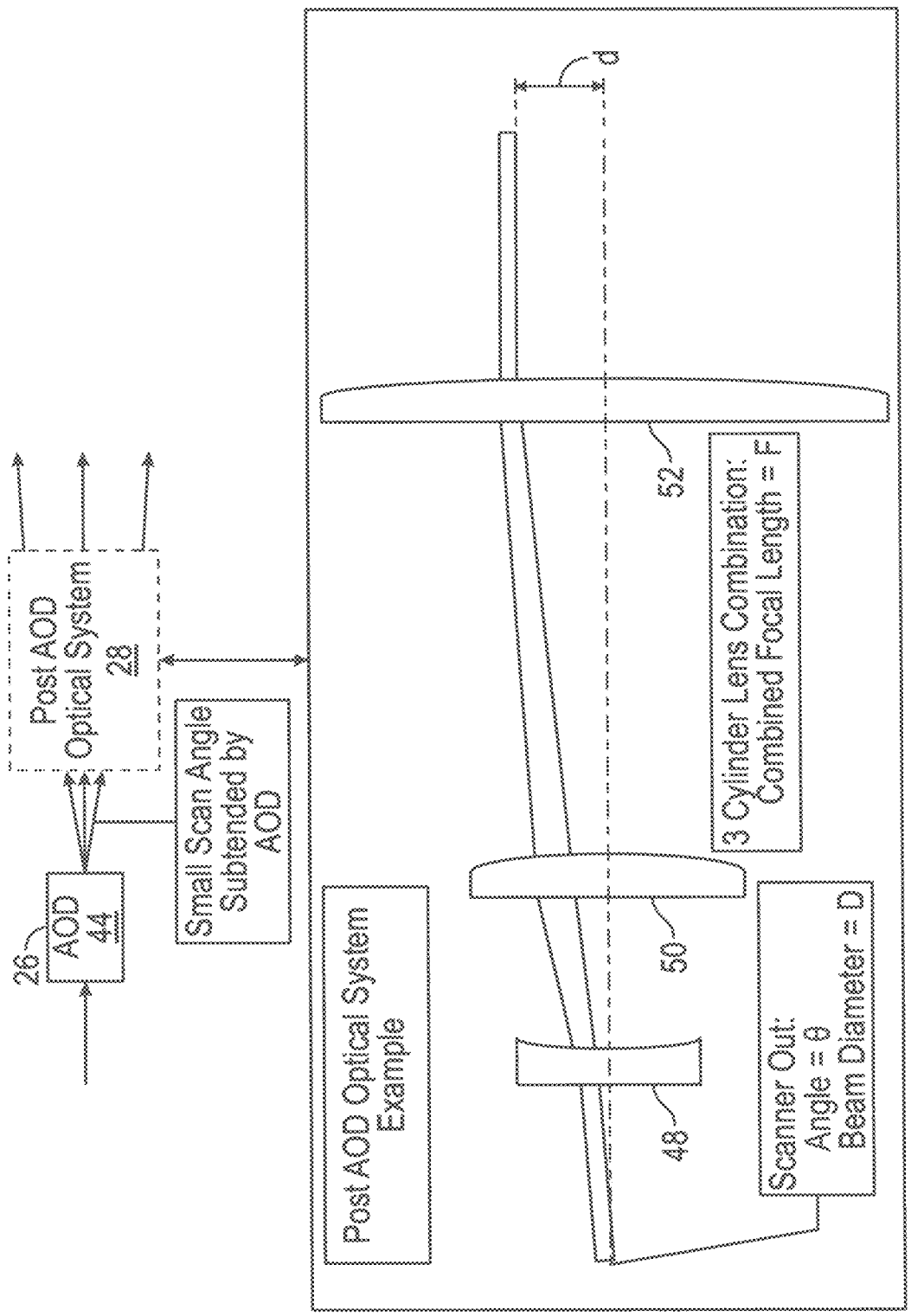

Known Art

Known Art

FIBER LASER APPARATUS AND METHOD FOR PROCESSING WORKPIECE

BACKGROUND OF THE DISCLOSURE

Field of the Disclosure

This disclosure relates to a method and apparatus utilizing a continuous wave (CW) or quasi CW (QCW) high duty fiber laser and high speed scan system for processing amorphous thin films, wherein the implemented laser power, beam profile and scanning velocity generate desired exposure duration and fluence.

Prior Art

The application of burst-mode QCW fiber lasers in fiber laser annealing (FLA) and sequential lateral solidification (SLS) method of annealing flat display has been known. For example, burst-mode QCW fiber lasers used in annealing process are disclosed in PCT application number PCT/US16/40222 (PCT 40222) fully incorporated herein by reference and co-owned by the Assignee of the current application. The results demonstrated by a burst-mode QCW fiber laser, i.e., laser operative to output multiple long bursts or packets of ultraviolet (UV) light, wherein each burst is defined by multiple pulses emitted at a pulse repetition rate (PRR) (also referred to herein as a pulse repetition frequency (PRF)) which is higher than that of the burst repetition rate (RR), have been shown to be comparable with those of excimer lasers. The QCW fiber lasers are disclosed in detail in U.S. application Ser. No. 14/790,170 (now U.S. Pat. No. 9,941,120 (US '120)) which is also co-owned with the current application and fully incorporated herein by reference.

The advantages of burst-mode QCW fiber lasers, when compared, for example, to excimer lasers used in both SLS and excimer laser annealing (ELA) methods, are detailed in PCT 40222. However, the burst-mode QCW fiber lasers are not without certain question marks when compared to a "regular" QCW fiber laser that emits a train of pulses at a uniform PRR in the context of the above discussed annealing process.

For example, continuous scanning of a burst-mode QCW fiber laser source worsens average vs. peak power efficiency relative to a QCW (or CW) fiber laser operating at a PRR which is higher than that of the burst-mode QCW laser. The lower efficiency of the burst-mode QCW is due to the fact that its duty cycle is nowhere close to that of the "regular", high PRR QCW which may approach 100%. Thus, for equivalent laser peak powers, processing speeds achievable by the burst-mode QCW fiber laser are slower than those by the high duty regular QCW fiber laser, the advantage justifying a need for use of regular QCW fiber laser in Si annealing and other surface treating process.

Also, Si annealing systems based on the burst-mode QCW fiber lasers require a homogenizer for obtaining the desired intensity profile along a scan axis. In contrast, this intricate and high-cost equipment is not part of the Si annealing system with a regular QCW.

Still another disadvantage of a burst-mode QCW fiber laser by comparison with a regular QCW fiber laser includes the dependence of the length of exposed lines from the laser burst energy. Accordingly, the long stripes exposed to the burst-mode QCW laser require a high laser burst energy. In contrast, the exposed stripe has a length independent of the regular QCW fiber laser's power due to the improved duty cycle and scanning method.

Controlling power stability and mode stability of a burst-mode QCW is more difficult than controlling the same parameters of a regular QCW operating at a higher and constant PRR. Besides, in contrast to a burst-mode QCW fiber laser, a regular QCW fiber laser can be used in more annealing applications.

A need therefore exists for a variety of Si film annealing applications and particularly those requiring long lines which benefit from the advantages of a regular QCW fiber laser over a burst-mode QCW fiber laser.

The use of the apparatus of PCT 40222 revealed problems which were not anticipated during the development stage of the disclosed in this patent apparatus. For example, different scanner configurations are disclosed in PCT 40222—each of which has its advantages and disadvantages with the latter being somewhat underappreciated in terms of the impact they may have on the final product. The galvanometers are known for their limited deflection angle velocities due to the mass of moving parts. The velocities are not a problem for acousto-optic deflectors (AODs), but the limited deflection angle range is. Rotating mirror scanners and more specifically those with multiple reflective facets—polygons—are known to have manufacturing defects that detrimentally affect the quality of annealing and particularly, the uniformity of the fluence profile along the stripe or line in the scanning direction. The polygons are utilized in a variety of optical configurations that are particularly designed for annealing long stripes, i.e., preferably longer than 2 mm. Thus, it is desirable that, in annealing applications involving the use of the scanner, a polygon have as few manufacturing defects as possible.

The burst-mode QCW fiber lasers of the PCT 40222 are primarily used for annealing panels which are orders of magnitude larger than the length of the line beams from individual burst mode fiber lasers. The beam stitching has been accompanied by the formation of Mura, a phenomenon observed on the laser treated panels which results in a low contrast and non-uniform brightness which can be exhibited by a "rippled" appearance in the laser treated substrate. The Mura is an unacceptable defect since the quality of annealed polysilicon (p-Si) panels is poor and thus limits the use of burst mode QCW fiber lasers in annealing processes.

The known fiber laser-based annealing systems typically have a complex structure including multiple sub-assemblies. For example, the use of burst-mode QCW fiber lasers in the SLS process requires a homogenizer, such as a Fly's eye, aspherical, a cylindrical and other homogenizing means. Controlling power stability and mode stability of burst mode QCW fiber lasers, operating at a relatively low repetition rate, comes with technical difficulties. The average vs. peak power efficiency of burst QCW fiber lasers should be improved.

A need therefore exists for a scanning method utilizing a CW or high duty QCW laser for processing amorphous thin films, wherein the implemented laser power, beam profile and scanning velocity generate controlled exposure duration and fluence that is equivalent to a specified duration or burst mode QCW fiber laser but without the above-noted problems associated with the latter.

A further need exists for a CW laser capable of operating in a high duty QCW laser mode which along with a high speed scanner, is capable of remedying at least some of the known and identified manufacturing defects.

SUMMARY OF THE DISCLOSURE

In accordance with the disclosure, the inventive method is applied to a variety of applications including, without any limitation, fiber laser annealing (FLA) amorphous Si annealing, sequential lateral solidification (SLS) amorphous Si annealing, silicon carbide (SiC) annealing (e.g., ohmic contacts), and polyimide laser lift-off (LLO) applications. The inventive method, utilizing a "regular" QCW fiber laser and high speed scanner assembly, includes selecting laser energy, spot beam characteristics and scanning velocity based on the desired exposure duration and fluence, which are known to bring about the desired results in a surface treating process that utilizes excimer and burst QCW fiber lasers. The spot beam characteristics include length, width and intensity profile of the light spot on the target substrate. The inventive concept related both to the disclosed method and apparatus implementing the method has numerous aspects that all are structurally and functionally intertwined with one another, as will be seen from the following discussion.

In accordance with one aspect of the disclosure a regular QCW laser operates at the controllable duty cycle of at most 100% such as to output a beam at a desired power P. As the beam propagates along a pre-scan path, it is temporarily divided or chopped by a scanner assembly into a plurality of sub-beams deflected off the pre-scan path within a desired angular range towards the surface to be treated, such as amorphous silicon (a-Si) film along a post-scan path.

The individual sub-beams each, impinging upon the a-Si, forma spot that has the desired geometrical parameters, such as spot length $L_s$, spot width $W_s$ and desired intensity beam profile in both scan and cross-scan spot axes coinciding with respective scanning and cross-scanning directions. The intensity profile in the scanning direction is particularly important for obtaining good results which can be comparable to those obtained in FLA and excimer laser annealing (ELA) processes. The spot width $W_s$ is rather small and profile non-uniformities, if they exist, are practically undiscernible but still may be controlled, if necessary. The spot beam parameters are determined by optical pre/post-scan assemblies designed for the productions of short and/or long stripes of the desired length, wherein the short stripe is a line having a lengths of at most a few millimeters.

The spot beam with the desired spot beam parameters is swept in the scanning direction at a desired scanning velocity $V_{scan}$, thereby forming a stripe on the film of a predetermined length $L_{scan}$ and width $W_s$. The desired scanning velocity and beam profile generate a controlled exposure duration at each location of the stripe, which provides the desired fluence distribution in the scanning direction at each of these locations and, as a result, all over the area of the stripe.

As the stripe with the desired length $L_{scan}$, width $W_s$ and fluence distribution is formed, it is necessary that the rest of the surface is laser treated at least in the cross-scan direction, which corresponds to the length of the surface. This is accomplished by continuously displacing a platform supporting the surface in the cross-scan direction so as to sequentially form a plurality of consecutive scanned stripes spaced from one another at a distance dy. The speed of displacement of the panel in the cross-scan direction is so selected that distance dy is at most equal to spot width $W_s$, and in some instances the distance dy varies between 0.025Ws to Ws. The formation of stripes covering the desired length of the panel constitutes a column with a column width corresponding to the length of the stripe $L_{scan}$.

In a following aspect of the disclosure, all of the above parameters are so selected and controlled such that the desired fluence distribution may or may not be uniform. If after the formation of the column, the fluence distribution does not meet the expectations, the process disclosed in previous aspects is repeated until the desired results (i.e., desired fluence) are obtained.

In a process typically requiring multiple irradiations of the same film's location, such as FLA, it is necessary that a period between subsequent irradiation of the same location be strictly controlled. This can be explained by the nature of any given process. For example, in FLA processes, the entire film depth should not be annealed. Also overheating the film leads to its destruction. Accordingly, since the displacement of film in the cross-scan direction is continuous, the displacement is performed such that the temperature of the previously irradiated location ready to be illuminated again corresponds to the theoretically or empirically determined thresholds.

Another aspect is concerned with controlling the scanning velocity $V_{scan}$, and laser beam energy so that the thermal reaction of each spot during the formation of individual columns is manifested by a partially melted triangularly-shaped film area. Under the desired conditions, this area has an apex spaced from the spot in a counter-scanning direction at a length $L_s$ which is at least 10 times greater than the stripe width $W_s$.

If the disclosed QCW fiber laser operates with the duty cycle less than 100%, then it outputs the beam at a pulse repetition frequency (PRF) from 80 to 200 MHz which is sufficient to generate a thermal response of the a-Si identical to that caused by the beam from the QCW fiber laser operating as an equivalent CW operating at 100% duty cycle.

Another aspect of the disclosed method relates to the stripe length which may be substantially the same as or smaller than the width of the panel or the devices manufactured therefrom. In the latter cases, multiple columns are needed to cover the desired width of the panel or device. The latter is realized by displacing the surface to be treated in the scanning direction at a distance dx which is at most equal to the column width $L_{scan}$. As a result, once the film is displaced in the scanning direction at the desired distance, all of the above disclosed features or steps are repeated so as to form as many columns as necessary to cover the whole width of the film. If displacement at a distance dx in the scanning direction is required, this distance along with the distance dy between subsequent stripes of individual columns are selected such that each location of the processed film is irradiated up to 50 times. The displacement in the scanning direction is to be controlled so as to avoid such an undesirable phenomenon as Mura associated with overlaid columns. The distance dx between adjacent columns depends on stripe length $L_{scan}$ and should not exceed a distance which is known to produce Mura effects in a given process. In a situation typically associated with short scan length, this distance preferably is up to 0.5 mm and controlled during the disclosed process, and in some instances is up to 50% of the scan or stripe length.

Another feature, which is an integral part of any of the above-discussed aspects, includes the situation in which dy and dx may vary from column to column.

In both SLS and FLA crystallization processes featuring QCW fiber lasers, it may be preferable to implement a temporal profile similar to that of an excimer laser. Typically, in the standard ELA annealing process, an excimer laser beam has the following intensity temporal profile: a short duration, high intensity spike, followed by a longer duration, lower intensity tail. This temporal profile allows the initial spike to cause melting of the Si film, while the tail portion allows controlled cooling and crystallization of the melted film.

Accordingly, the disclosed methods and associated configurations are configured to allow for the modification of the intensity profile in the scanning direction and include overlapping multiple Gaussian beams such that the spatial offset between the beams, and the dimensions and powers of the individual beams, create the desired temporal profile that may be adjusted for the optimized annealing process. Multiple beams can be generated by multiple lasers, for instance by splitting the beam of a single laser, or by implementing multiple lasers with split beams. The desired intensity profile may include Gaussian, Super-Gaussian or any other desired type in the cross-scanning direction. The same profiles relate to the cross-directional intensity profile.

The process of any one of the previous aspects may further include controlling polarization of the beam such that the polarization of the sub-beam incident on the film is perpendicular to the scanning direction, thereby controlling alignment of the polycrystalline grains.

Preferably each of the above features relates to a single mode (SM) beam output by the disclosed QCW fiber laser. However, some of the applications do not have strict limitations to the beam quality parameter. As a consequence, the beam may be either SM or multimode (MM).

The scanner unit disclosed in any of the above aspects includes an acousto-optical deflector (AOD), a plurality of rotating mirrors or facets assembled together to define a polygon, or the AOD and polygon. In any schematic of the scanner unit including the polygon, the inventive feature includes calibrating the latter for the following reasons.

Multi-facet polygons are prone to facet pointing errors with respect to the plane of rotation. Depending on the tolerances of the particular implementation, it may be necessary to implement facet correction. At high rotational frequencies, the short dwell time per facet precludes opto-mechanical pointing correction. In this case, the implementation of the AOD may be required, with its requisite optical efficiency, which is typically less than 80%.

The AOD has a number of advantages inherent in its structure. Besides having fast pointing correction times which are substantially less than 10 μs, it is used in all aspects disclosed above to modulate the beam on and off as the polygon apexes pass through the beam. It also can be used to make fine adjustments to laser power incident on the target within an individual scan line and/or to make long term power drift/fluctuation corrections.

In a further aspect of the disclosure, the AOD is used to control a focal depth. This feature includes modulating a radio frequency (RF) at the input of the AOD so as to adjust a divergence of the sub-beams, thereby altering the focal depth.

Another aspect of the disclosure includes a variety of post-scan optical configurations. Depending on the desired length of stripes, the optical configuration may include an F-theta lens that may be used in producing long stripes. The production of short lines may also require demagnifying optics. A particular feature of this aspect relates to the situation where the beam image in one of the directions, such as the scan direction, does not require demagnification, but in the other, cross-scan direction, the size of the beam should be demagnified.

BRIEF DESCRIPTION OF THE DRAWINGS

The above and other aspects and features, which can be used individually or in any combination in the inventive method and apparatus, will become more readily apparent from the following drawings, in which:

FIG. 20 is a schematic of the combination of FIG. 19;

FIG. 21A and FIG. 21B are respective exemplary configurations of the post-scan assembly of FIG. 20;

Figure 1:
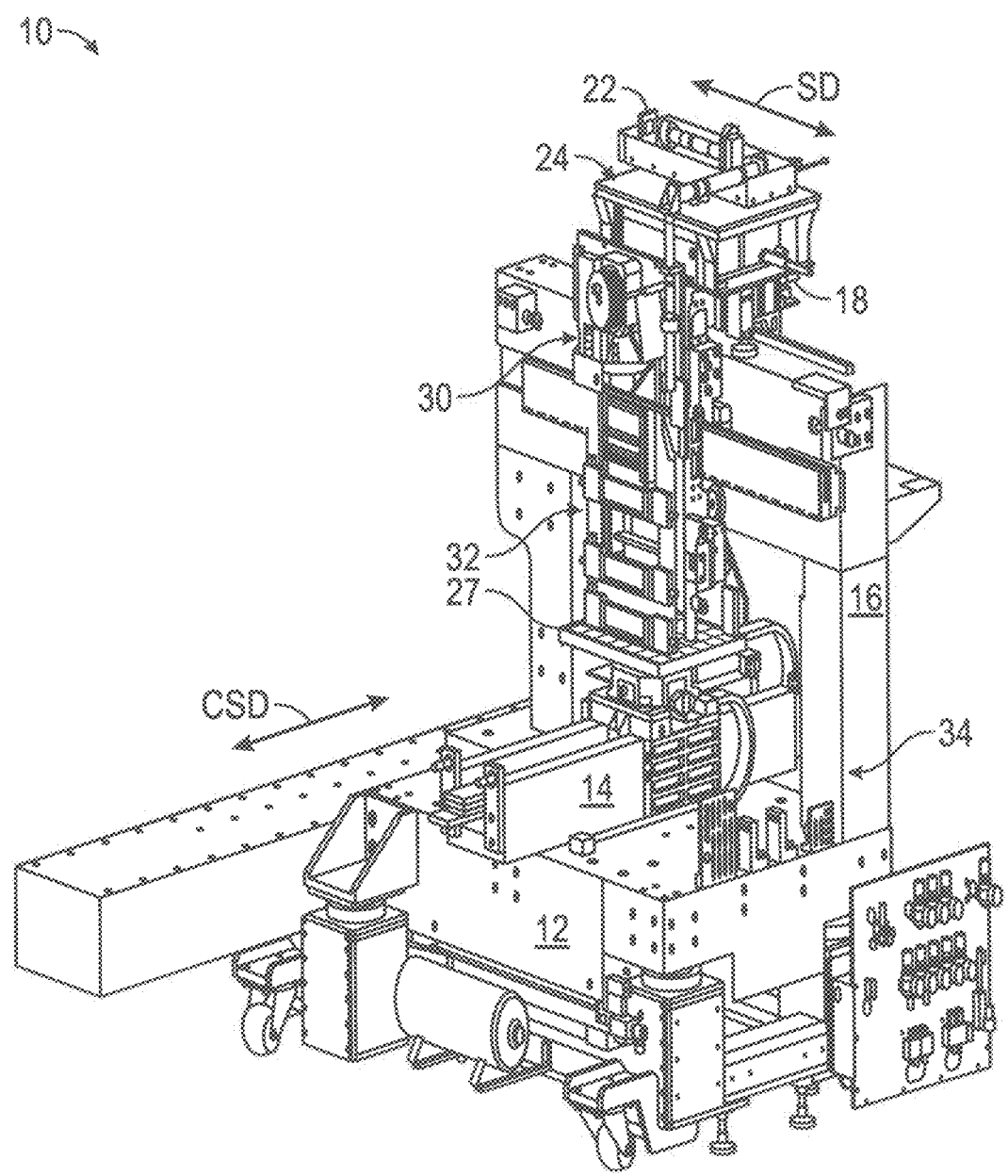
FIG. 1 is an isometric view of the inventive annealing apparatus executing the inventive method.
Figure 2:
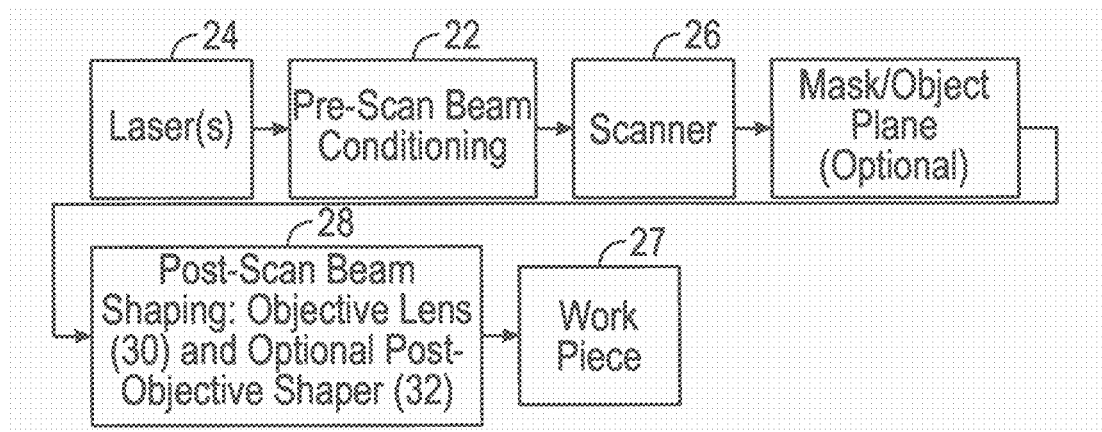
FIG. 2 is a flow chart representing the inventive method.

Reference will now be made in detail to the disclosed system. Wherever possible, same or similar reference numerals are used in the drawings and the description to refer to the same or like parts or steps. The drawings are in simplified form being far from precise scale. For purposes of convenience and clarity only, the terms "connect," "couple," and similar terms with their inflectional morphemes do not necessarily denote direct and immediate connections, but also include connections through mediate elements or devices.

The goal of the present invention is the use of a standard QCW fiber laser in combination with a high-speed scanner to process Si films with the quality comparable to that of the films processed by excimer and burst-mode fiber lasers. The premise that allows achieving this goal is based on controllably exposing the Si film to a specifically shaped laser beam which is scanned at a predetermined scanning velocity across the film's area such that the treated area is characterized by the desired fluence, which in the case of a FLA process preferably varies between 0.35 and 0.45 J/cm$^2$. Thus, the process is predicated on controlling main system variables—spot beam length, width and intensity profile, i.e., spot geometry and scanning velocity—to obtain the desired exposure duration and fluence for given laser characteristics including a power, divergence, astigmatism and polarization. The control of the system variables and laser characteristics is done by respective assemblies and their combination, as disclosed below.

Referring to FIGS. 1-4, an inventive modular apparatus 10 may have a variety of layouts capable of performing the inventive process. At a very basic level, the inventive process may be accomplished by forming (1) long irradiated areas or stripes on the workpiece surface reaching up to a meter in length, or (2) short areas or stripes, generally not exceeding a few millimeters in length, for example 2 mm. Depending on the length of the stripe, selective sub-assemblies of the inventive apparatus may have different configurations. However, the functionality of these subassemblies remains practically the same.

The apparatus 10 is operative to process a workpiece surface, for example thin Si film workpiece 27, such that a-Si is converted to p-Si in accordance with the FLA process typically requiring about a 20-time radiation of each location of workpiece 27, if of course the entire surface is to be annealed. Although the following operation of apparatus 10 is disclosed in the context of FLA, the inventive apparatus can effectively function in accordance with SLS, SiC annealing (e.g. ohmic contacts), and polyimide LLO processes.

Irradiating each location of the film multiple times to meet the required fluence and exposure duration, apparatus 10 can process small workpieces each of which has a width of no more than a few millimeters, and large workpieces each with the width reaching meters. In summary, apparatus 10 is operative to form in a scanning direction both individual long stripes, each effectively covering the desired, and in certain instances the entire width of the large panel, and short stripes which, if needed, can overlap in the scanning direction to cover the desired width of large panels.

The inventive apparatus 10 of FIG. 1 has a modular structure including several reconfigurable assemblies. The apparatus 10 includes a laser source assembly 24, pro-scan assembly 22, scan assembly 26, post-scan assembly 28, and a workpiece supporting stage 34. The post scan assembly 28 is typically configured with, among others, an objective lens assembly 30 and optional post-objective lens beam shaper 32, which in the shown example is configured as a telescope. Each of these subassemblies is discussed below in further detail.

The shown layout of apparatus 10 represents just one of many possible configurations all operative to carry out the inventive concept. As such, apparatus 10 includes a base 12 supporting a stage 14 which is operative to displace a workpiece 27 mounted on the stage in a cross-scan direction (CSD) and scan direction (SD). Π-shaped frame 16 coupled to base 12 supports a stage 15 guiding a carriage 18 with laser source assembly 24, post-scan beam shaping assembly 28, which may include objective lens assembly 30 and post-objective beam shaping 32, in the SD. Although stage 15 is shown upstream from the post-scan assembly 28, it can be located downstream therefrom.

In operation, a laser beam from laser source assembly 24 propagates along a pre-scan light path while undergoing conditioning in pre-scan assembly 22 which is operative to adjust a beam power, polarization and geometry including spot beam's dimensions. In the shown configuration, the spot beam impacting scanner is circular, but as one of ordinary skill readily realizes, any beam shape is possible subject to the footprint of apparatus 10 and optical configurations that provide the apparatus with the desired footprint. Upon being incident on scan-assembly 26, which rotates in a scan direction (SD), the conditioned beam is segmented into a plurality of sub-beams deflected along a post-scan light path where the deflected sub-beams each are processed in post-scan beam shaping assembly 28. The post-scan assembly 28 is an optical configuration processing each sub-beam beam from scanner assembly. Depending on the configuration of post-scan assembly 28, apparatus 10 may have one or multiple cylindrical post-objective lenses applying final touches to the shape and dimensions of the spot beam in the CSD which is formed on and scanned over the surface of displaceable workpiece 27 during a predetermined exposure time and fluence.

Referring specifically to the configuration of FIG. 1, QCW fiber laser source assembly 24 outputs, for example, a pulsed beam with a certain nominal power. The pre-scan assembly 22 is configured with an optical schematic operative to shape the beam such that it has the right size, shape, and divergence all selected to correspond to the dimension of the given scanner, such as a polygon included in scan assembly 26 of FIG. 1.

Concretely in this schematic, the beam shape is circular. The pre-scan assembly 22 further may have power attenuators, as disclosed below, which are used for adjusting the constant laser output power to the desired level. Deflected from the polygon, which chops the laser beam into multiple sub-beams corresponding to respective facets, the sub-beams propagate through an objective lens 30 of post-scan assembly 28, which is an F-theta lens. The F-theta lens is configured to adjust the length of the spot beam in a scan axis. For example, with the increased spot beam length, a scanning velocity should be increased in order to obtain the desired exposure duration. The post-objective shaper 32 in the shown structure is a telescope to adjust the spot beam width in the CSD so as to obtain the desired aspect ratio of the spot. As a consequence, the correctly dimensioned spot is dragged along the determined scan length at the determined velocity and power which, in turn, provides the desired exposure time and fluence.

Figure 3:
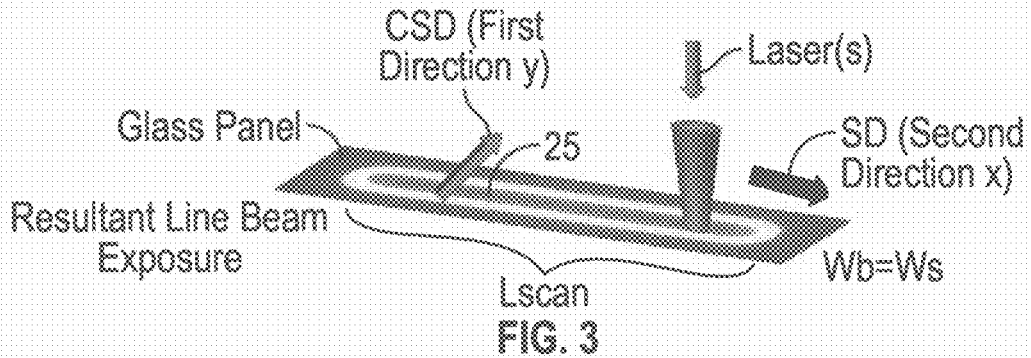
FIG. 3 is a schematic representation of the operation of the apparatus of FIG. 1 forming a stripe on the Si film to be annealed.

FIG. 3 illustrates a resultant stripe 25 with a length $L_{scan}$ formed by a single spot beam of length $L_s$ and width $W_s$ upon dragging the desirably shaped and dimensioned spot beam in the scanning direction during the predetermined exposure duration such that the fluence is distributed uniformly over stripe 25.

Figure 6:
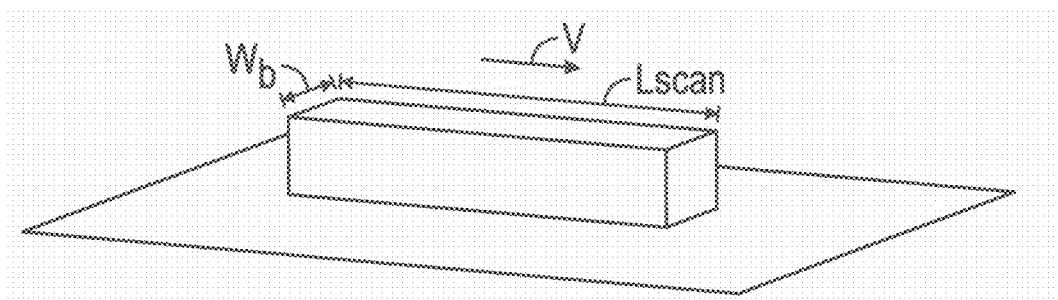
FIG. 6 is a view of an ideal top hat beam intensity profile.

Referring briefly to FIG. 6, the following may provide a better understanding of how the desired values can be obtained. For the sake of simplicity, a beam having an ideal top hat beam intensity profile is assumed, although other profiles such as Gaussian and super-Gaussian are equally possible. Given a spot beam of length $L_s$, traveling at velocity $V_{scan}$, the exposure duration is determined as:

$$t_{exp}=L_s/V_{scan}$$

The above equation can be rearranged to give the required scan velocity:

$$V_{scan}=L_s/t_{exp}$$

For on target laser power, P, and spot beam width, $W_s$, the intensity I is:

$$I=P/L_s W_s$$

The scanning fluence H at any point is:

$$H=It_{exp}=Pt_{exp}/L_s W_s$$

Combining the above: for desired fluence, H, and exposure time $t_{exp}$, with laser power P and spot beam width $W_s$ the required spot beam length $L_s$ and scanning velocity $V_{scan}$ are:

$$L_s=Pt_{exp}/HW_s$$

$$V_{scan}=P/HW_s$$

EXAMPLE

Laser power=150 W
Line beam width=5 μm
Desired exposure duration=300 ns
Desired fluence=0.7 J/cm² (7,000 J/m²)
Required line beam length=1.3 mm
Required scanning velocity=4,300 m/s The goal of the current invention is to obtain the results in certain surface treating applications using fiber lasers which would be comparable to those obtained by well-known methods and excimer laser devices carrying out respective known methods. For example, in production of flat panels, an excimer laser ruled supreme until fairly recently when fiber lasers started emulating the results of excimer lasers. What it means is that certain process parameters of, for example, ELA such as exposure duration and fluence on target are empirically known. Accordingly, taking a different structural approach, like here, does not mean that everything is to be changed (e.g., a desired exposure duration and/or fluence). On the contrary, both the known fluence, which lies in a 300-450 mJ/cm², and exposure duration from 100 to 500 ns are two critical components upon which the inventive apparatus and its sub-assemblies may be constructed. Therefore, based on the known process parameters, it is easy to determine the apparatus parameters including but not limited to the scan length, scanning velocity, laser power and other device parameters using simple calculations which are disclosed above. Once the apparatus parameters are determined, a variety of specific structures of each and every assembly can be configured to obtain the determined parameters subject to the overall footprint of the entire device, its efficiency and, of course, cost.

Figure 4:
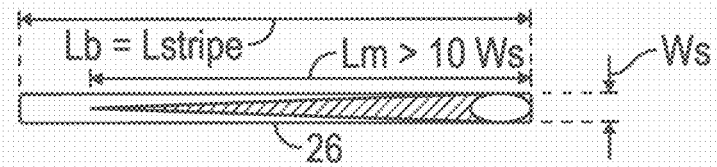
FIG. 4 is a schematic view of a single stripe formation.

FIG. 4 illustrates a resultant stripe 25 of the Si film characterized by the desired thermal reaction, i.e., the desired fluence which leads to uniform p-Si grains. The desired thermal reaction to the illumination of each location (only one is shown) along stripe 25 to be formed is characterized by a triangularly shaped melted region with the length $L_m$ being more than 10 times the width of spot $W_s$. If such a reaction is confirmed during the inventive process (e.g., by an appropriate X-ray technique), the desired fluence distribution over the area of stripe 25 will be reached over the specified exposure duration. This relationship between the length and width of the melted region was initially modeled theoretically and then supported by subsequent numerous experiments.

Figure 5:
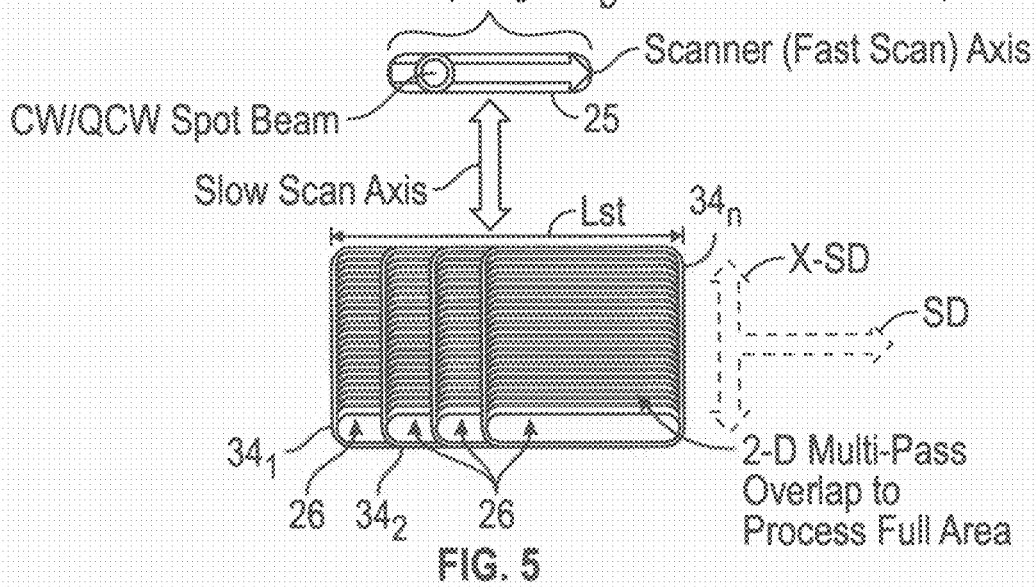
FIG. 5 is a schematic view illustrating multi-pass overlap for a single location in scan and cross-scan directions using short line beams.

FIG. 5 illustrates the inventive process by using short line beams that are each no longer than a few mm to form a resultant long stripe having a desired total stripe length $L_{st}$ of up to a meter or more. Generally speaking, the formation of short stripe 25 having a length $L_{scan}$ that exceeds the individual spot or line beam length includes first, forming a first column 34₁ and then a subsequent second column 34₂ such that coplanar and collinear short stripes 25 of respective first 34₁ and second 34₂ (and subsequent columns 34ₙ) overlap one another. This process continues until the desired total stripe length $L_{st}$, and more precisely until the desired area, is crystallized.

The columns 34 each are formed by activating stage 15 such that at least one short stripe 25 extending in the SD is formed. Ultimately a plurality of stripes 25, which are offset from one another in the CSD at a desired distance dy by utilizing stage 14 displacing workpiece 27 in the CSD, are provided to define a column 34. Once the first column 34₁ is formed with the desired length and width, stage 14 displaces the workpiece 27 in the SD at a distance dx, corresponding to the desired overlap between subsequent stripes 25 in the SD. The process continues analogously to the formation of the previous column until the second column is completed. Since the workpiece is displaceable in both X and Y directions, the process of forming long lines (i.e., stripe lengths) by overlapping shorter scanned stripes 25 may be referred to as a 2D scanning process. The pitches in both SD and CSD directions are selected to provide each location of the processed area with multiple spot beam illuminations. If the length of the individual stripe 25 is sufficient alone to cover the desired area, then no overlap in the SD is required, and the multiplicity of spot beams incident on each individual location is defined by the offset dy between subsequent stripes in the CSD.

Figure 7A:
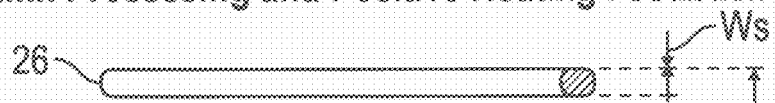
FIGS. 7A-7D illustrate different step patterns used in the column formation with each being designed to prevent overheating of the material to be processed.
Figure 7B:
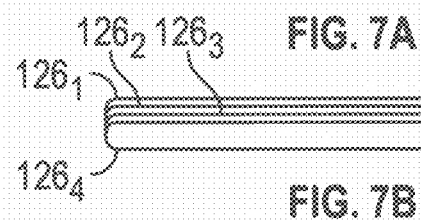
Figure 7C:
Figure 7D:

FIGS. 7A-7D illustrate the formation of individual columns 34 each including, for example, a plurality of "stacked" parallel stripes 25 in the CSD. As can be seen, adjacent stripes 25 shown in respective FIGS. 7A-7D are offset in the CSD at different distances dx 126. This can be explained by the fact that any thermally treated surface should be monitored to prevent the onset of surface temperatures capable of destroying the thin Si film. This is particularly important for a thin Si film with multiple irradiations of each film location. Accordingly, if the temperature along the beginning of just formed stripe 25, as estimated, for example, by a sensor assembly 36, reaches or is close to the predetermined threshold, then the following stripe should be spaced at a greater distance since the formation of the latter can only increase the already dangerous temperature. Referring specifically to FIG. 7B adjacent stripes 126₁-126₄ are spaced at a small pitch corresponding to the overlap which covers about 80% of the spot width $W_s$ which may be, for example, in a range of 1 microns to 10 microns, for instance, 1 μm, 2 μm, 10 μm. In contrast, dx in FIG. 7D corresponds to the entire spot width indicating that the temperature of the film occupied by the previously formed stripe is dangerously high.

The temperature control can be realized by measuring an optical diffraction response signal from the processed Si film areas, comparing these measured results with a stored reference value, computing a comparison result based on a difference between the measured value and the reference value, and outputting a control signal to stage 14 that shifts the displacement of the next stripe at a certain distance based on the comparison result. Thus, apparatus 10 is configured with a diffraction response sensor assembly 36 that utilizes a feedback scheme.

Even in the context of the FLA process, there is a possibility to obtain such a working regime when subsequent stripes practically have a very small overlap or no overlap at all and yet produce satisfactory results. Typically, however, if the total number of irradiations and thus overlaps, which for example can be 20 times at a given location, if the CSD changes, let's say from stripes to 2 stripes, then the number of overlaps in the SD should be increased from 5 to 10 so that the location receives the requisite 20 hits. In other words, the pitches (i.e., dx, dy) in both directions may vary, but their total product remains unchanged which leads to the desired fluence and exposure duration.

Figure 8:
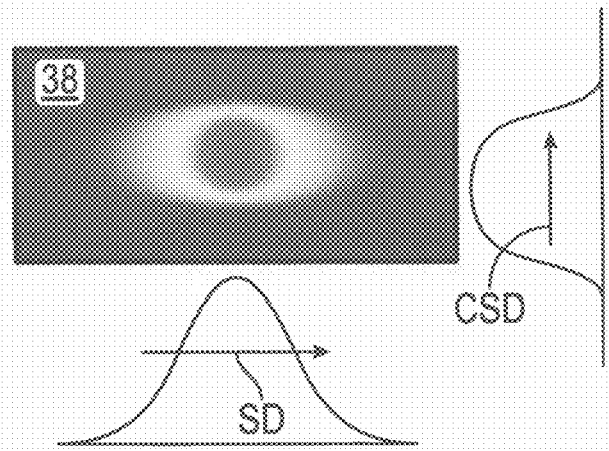
FIG. 8 is an exemplary view of a beam spot with accompanying Gaussian and super-Gaussian intensity profiles in respective scan and cross-scan directions.

Referring to FIG. 8, the desirable intensity profiles of spot beam 38 in respective SD and CSD are shown. These profiles along with the spot geometry are critical to the exposure duration and fluence distribution. As an example, the intensity profile along the scan axis of the elliptical spot is purely Gaussian, whereas the profile along the cross-scan axis in the CSD, as shown, is super-Gaussian. In some instances, super-Gaussian power factor is bigger than 2. Obviously, the spatial profiles may controllably vary among Gaussian, super-Gaussian, and flat top profiles. Also, if needed, other profiles may be used by employing several laser sources or optics, as disclosed below. The spot width is a result of optical configurations associated with the pre- and post-scan assemblies which can be configured to form any reasonable spot/stripe length and width.

Turning now to the description of the assemblies constituting apparatus 10, laser source assembly 24 includes one or multiple QCW fiber lasers each operating with a duty cycle of at most 100%, which is equivalent to a CW mode of the laser operation. Any duty cycle below 100% is selected such that the surface to be treated, i.e., Si film, has the same thermal reaction as it would to the CW radiation, provided all other conditions are the same. The QCW fiber laser with a duty cycle less than 100% operates in the pulsed mode at a uniform high repetition rate between 80 and 200 MHz and even up to 1 GHz outputting preferably a single frequency (SF), polarized, substantially diffraction limited beam at 3xxnm and/or 5 xx nm wavelength with an $M^2 \leq 1.2$. The pulse duration varies from tens of nanosecond to hundreds of nanoseconds. The laser source 24 operates at an optimal constant output power, which, if necessary, is attenuated as the laser beam propagates along the pre-scan path. Depending on the emission wavelength of the laser beam, its power may reach about 1 KW (average power) for Green light and multi-kW for IR light. The output power of the utilized here QCW fiber laser operating in the pulsed regime may be controlled by manipulating its duty cycle.

Note that while a SF SM light beam is desirable particularly for FLA and SLS process typically associated with a 3xx-5xxnm wavelength range, other applications may not need such strict limitations on the beam quality and spectrum. In this case, of course, laser source 24 may be configured to output a multimode beam with a wide spectral line. In summary, the power, polarization, and beam quality parameter are part of the apparatus parameters that play a crucial role for maintaining the desired process parameters, such as the predetermined fluence and exposure duration, selected to achieve the same results as those obtained with a help of excimer and burst-mode fiber lasers.

The pre-scan assembly 22 of apparatus 10 functions as an optical beam conditioner providing the output laser beam with the characteristics appropriate for a given scan assembly 26. The beam conditioning includes shaping the spot beam with the desired geometrical shape, such as cylindrical or preferably elliptical, with the latter having a scan axis extending in the scan direction. Also, the size and divergence of the beam are adjusted to meet the geometrical restrictions imposed by the used scanner. In practical terms, various combinations of lenses, well known to the artisan, can easily realize these tasks.

In case of the AOD scanner, the beam incident on it should be collimated in the scan direction, necessitating the installment of a collimator, and properly dimensioned to correspond to a clear aperture of the AOD. In addition, pre-scan assembly 22 may include a homogenizer not necessarily for the scan assembly, but later for the desired intensity profile of the spot beam in either one of or both scan and cross-scan axes.

A power attenuator is also part of the pre-scan assembly. The necessity of the attenuator can be understood knowing how difficult it is to stabilize a laser system output in response to changing a pump, i.e., diode laser current. That is why in the present apparatus, the laser output power is optimal for a given laser but later it continuously and controllably varies to maintain the constant predetermined power level of the beam incident on the workpiece surface. The means that carrying out the power attenuation includes implementing variously configured polarizers and polarizing rotators which along with the power adjustment also provide the desired beam polarization. The practical implementation of the power attenuation requires power monitoring in the vicinity of the treated surface and feedback circuits between the power sensors and polarizers with a controller installed in the feedback circuit.

In summary, to provide the optimum operation of the scanner, the output beam from laser assembly 24 is conditioned to have the desired beam size in the scan and cross-scan axes. The beam is also conditioned to have the desired beam divergence in both scan and cross-scan axes. The polarization orientation may be optionally required not so much for the scanner operation, although it may be desirable, but also for a given application process. Optionally, the beam may undergo beam profile re-apodization in one or both axes, e.g., Gaussian transformed to super-Gaussian or top hat. However, in some instance both beam polarization and apodization may be accomplished by optics integrated within the QCW laser.

The scan assembly 26 receives the conditioned beam and deviates it with a desired angular velocity and angular range along a post-scan path toward workpiece 27. The scanner's configuration is selected from a polygon, AOD or a combination of AOD and polygon. A galvanometer, of course, can be used as well, but due to inherent limitations, such as scan velocity and others, it is unlikely to be efficient in the targeted applications. It is imperative that scan assembly 26 be characterized by a high and controlled velocity reaching km/sec. It is also preferred that the scan assembly 26 utilizes a high laser duty cycle exceeding 90%. The controlled variation of the scanning velocity, which can be done on the fly by utilizing control and feedback circuits, allows for the predetermined process parameters to be maintained, such as exposure duration and fluence distribution on the target.

Figure 9:
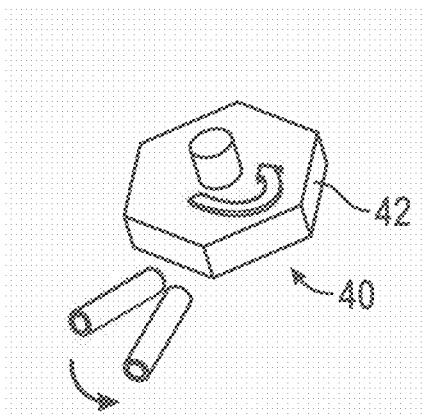
FIG. 9 is an isometric orthogonal view of a polygon.

Referring to FIG. 9, a common method used to scan a beam in one axis utilizes a spinning polygon 40 which may have one (monogon) or multiple (e.g. >30) facets 42 with 6 to 12 facets being rather standard. The beam may be in line with the plane of rotation (indicated by the arrow), or may be at an angle to the plane of rotation. The known advantages of the spinning polygon are large scanning angle ranges, which are easily subtended and are inversely proportional to the number of facets, and mature technology.

Figure 10:
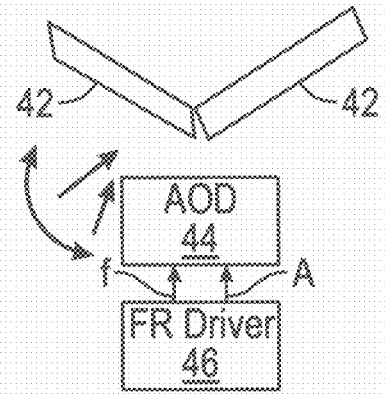
FIG. 10 is a schematic view of a means for correcting a facet to facet pointing error of the polygon of FIG. 9.

Referring to FIG. 10, facets 42 of polygon 40 are prone to facet pointing errors orthogonal to the plane of rotation. Depending on the tolerances of the particular implementation, it may be necessary to implement facet correction. At high rotational frequencies used here, the short dwell time per facet precludes opto-mechanical pointing correction. In this case, the implementation of an AOD may be required, which has its own optical inefficiency (typically <80%).

Different angular positions of facets 42 result in stripes not perfectly coinciding with one another on the surface of the motionless workpiece, which leads to undesirable fluctuations of fluence distribution and eventually to unsatisfactory crystallization of the Si film.

Figure 11:
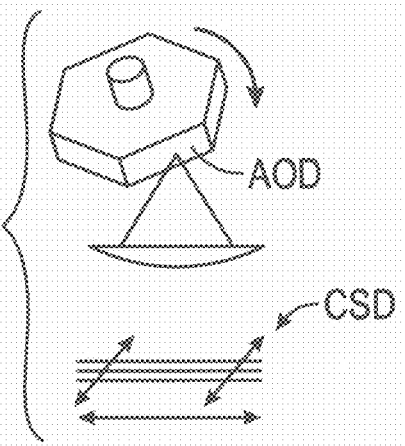
FIG. 11 is a schematic view of the operational principle of an AOD used in FIG. 10.

The pointing error correction is realized by implementing an AOD 44 upstream from polygon 40. The principle of operation of the AOD is well known: its RF driver 46 has frequency and amplitude modulation inputs. Depending on frequency, a beam is deflected from the facets in the cross scan direction CSD, as seen in FIG. 11. Accordingly, if using a fixed frequency for all facets, those facets that are inclined at an angle different from that of the "first" facet will produce stripes that are offset from the initial stripe in the cross-scanning direction. To compensate this offset, the divergence angle of each sub-beam deflected from the "defective" facets is varied by controllably adjusting the frequency from the available band of frequencies such that the offset among all stripes is within a 2-10% range.

There is always a possibility that a sub-beam power incident on the surface of workpiece 27 is not uniformly attenuated, for example, as a result of variations in the surface reflectance between facets. By modulating the amplitude via a feedback circuit the reflectance can be adjusted to the desired level for each facet in real time.

As polygon 40 rotates, light incident on the border between adjacent facets 42 is wasted. The AOD 44 is an ideal switch operating at high frequencies in ON/OFF modes. Accordingly, as the beam is expected to hit the border, AOD 44 is switched off and then back on as the following facet is in the position to deflect the beam.

As a switch, AOD 44 is operative to perform another function. Every polygon has facets designed for a certain stripe length. If for any reason the desired line length is smaller than that designed for the facet length, then the AOD is switched off prior to completing the scan of the designed length of the stripe.

Some surfaces, particularly large ones, may be insufficiently flat to remain in focus for long scanned lines. In this case, it is necessary to implement a focus compensation technique in pseudo-real time along the length of the line. For example, an application may have an allowable focus depth $\leq \pm 5$ µm. Even high precision panels typically have a thickness variation that exceeds the allowable flatness for sufficiently long scanned lines (e.g. up to a meter). An array of sensors may be positioned to measure the surface height along the length of the line. The sensor pitch is sufficient to ensure adequate spatial resolution with respect to the slope error of the panel surface.

Figure 12:
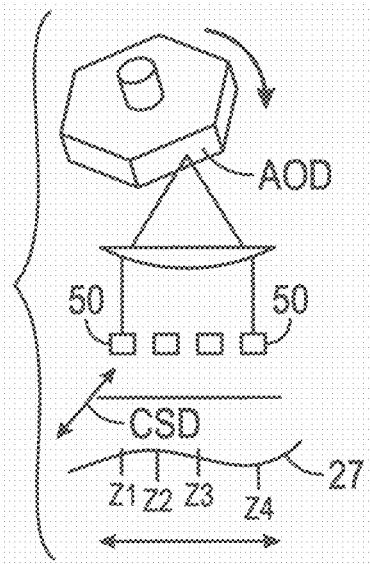
FIG. 12 is a schematic view of a correction scheme for compensating a focal plane due to the unevenness of the surface to be treated.

FIG. 12 illustrates a schematic for controlling the focal depth. Being more relevant for long stripes, for example 300 mm long, correcting the focus depth is essential for obtaining the desired crystallization. In the exemplary stripe, a 10 um width has the smallest depth of focus, and is the dimension that needs focus control with the AOD being ideally suited to do this since it deflects in the cross scan direction. Thus, the AOD can be used to adjust the divergence of the beam in the cross-scan direction by adjusting the frequency, which is selected from a narrow to broad spectral width, to compensate for a variable surface height.

Increasing or decreasing the divergence angle causes changes in the beam width with the following focal depth variations. The schematic of the control scheme may preferably include a plurality of sensors 50 placed ahead of the cross-scan axis, which extends in the CSD, to minimize any time penalties, but this is not a requirement. The scheme also includes a feedback circuit connected to the frequency input of the AOD via a central processing unit.

Figure 13:
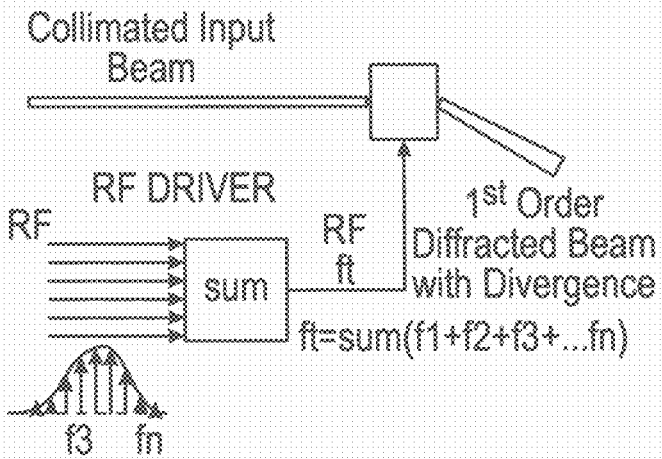
FIG. 13 is a schematic view illustrating an alternative approach for controllably varying a divergence angle of a laser beam used in the facet to facet pointing error and surface flatness compensation schemes of FIGS. 10 and 12.

FIG. 13 illustrates the approach for varying the divergence angle of the beam using an AOD. Instead of inputting a single frequency, multiple frequencies are simultaneously coupled into the AOD. As a result, multiple beams corresponding to multiple respective frequencies from the AOD diverge relative to one another. As will be disclosed later, this feature can be used for providing the desired intensity profile in the CSD.

The use of the AOD may be preferable, but not the exclusive device for compensating surface flatness. For example, a mechanical zoom may be used for the same purpose. If the scan velocity is slow, then it is reasonable to implement a mechanical device, such as a voice coil or piezo-electric actuator, to move an optical element (or elements) and thereby modify beam divergence. Because of the comparatively slow actuation speeds that can be achieved by such methods, this approach is only applicable for low laser powers and long, wide lines, where the scan velocity is slow but still in a km/sec range, which is incomparably higher than the cross-scan velocity varying in a m/sec range.

Figure 14:
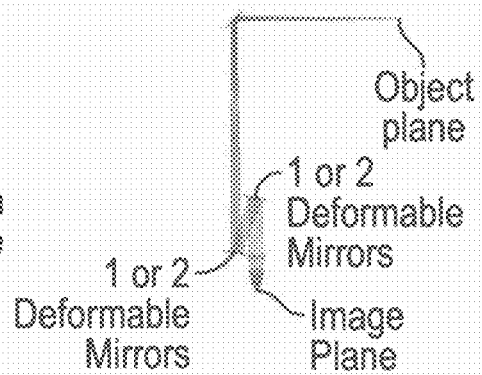
FIG. 14 illustrates an alternative optical scheme for surface flatness compensation.

FIG. 14 revisits the concept of focus compensation which can be realized by means other than the AOD. Another focus compensation schematic includes deformable optic(s). One or more deformable optics may be placed in line with the pre-scan path, such that the focus plane tracks the panel surface. The preferred implementation utilizes one or more deformable mirrors. The mirrors are deformable in one dimension, with a continuously variable radius of curvature along the length of the line beam. The radius of curvature is varied along the length of the mirror(s) to compensate for the variable height of the image plane.

The scanner configuration is associated with a corresponding schematic of post-scan assembly 28. For example, using polygon 40, whether it is incorporated in the inventive apparatus alone or in combination with the AOD, entails the utilization of an F-theta lens to form long stripes of up to a meter.

Figure 15:
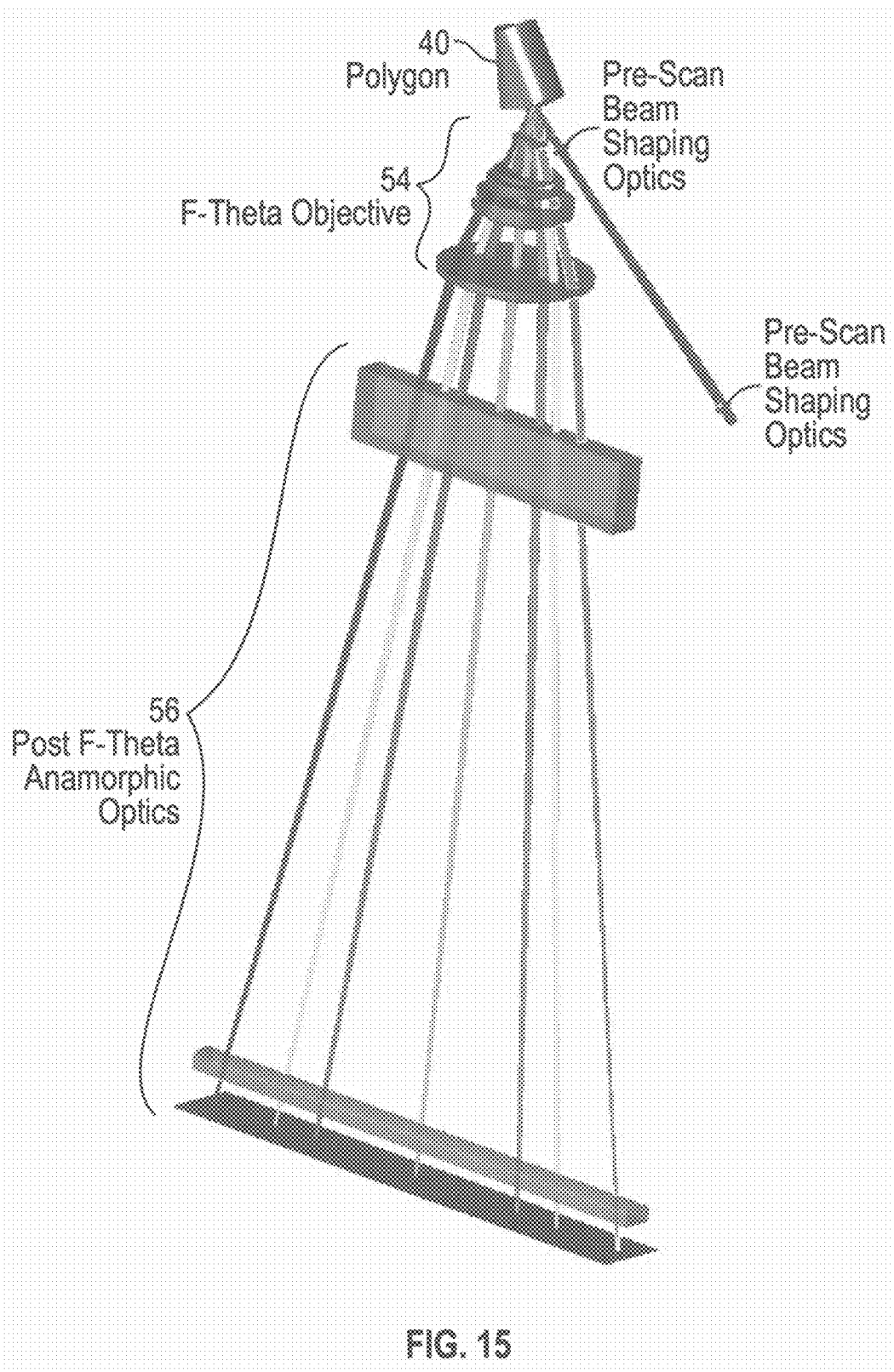
FIG. 15 illustrates an exemplary schematic of post-scan assembly operating in conjunction with the polygon shown in FIG. 9.

FIG. 15 illustrates an optical scheme including polygon 40 and the post-scan assembly which is configured with an F-theta objective lens 54 and object lens or lenses which include post F-theta anamorphic optics 56, which in certain instances may include one or more cylindrical lenses. The F-theta lens 54 controls the dimension of the scan axis of the spot beam, whereas post F-theta optics 56, which may include one or a combination of cylindrical lenses, adjust the dimension of the cross-scan axis of the spot beam. Typically, the illustrated scheme is advantageous for annealing long stripes 25. The beam intensity profile in the cross-scan axis preferably has a flat-top shape preserving the fluence homogeneity along this axis. To ensure this shape, a cylinder lens (or lenses) may be used in the post F-theta optics 56.

Returning to the scan assembly, it may include only an AOD. The advantages of an AOD include, among others, (a) fast sweep rate, (b) RF sweep can be conducted in ≤4 μs, (c) higher scan velocities on target than can be obtained with a polygon, (d) fast response times, (e) simultaneous modulation of amplitude and sweep rate to compensate for beam delivery system (BDS) non-uniformities/nonlinearities and laser power variations, and (f) modulation within sweeps.

Figure 16:
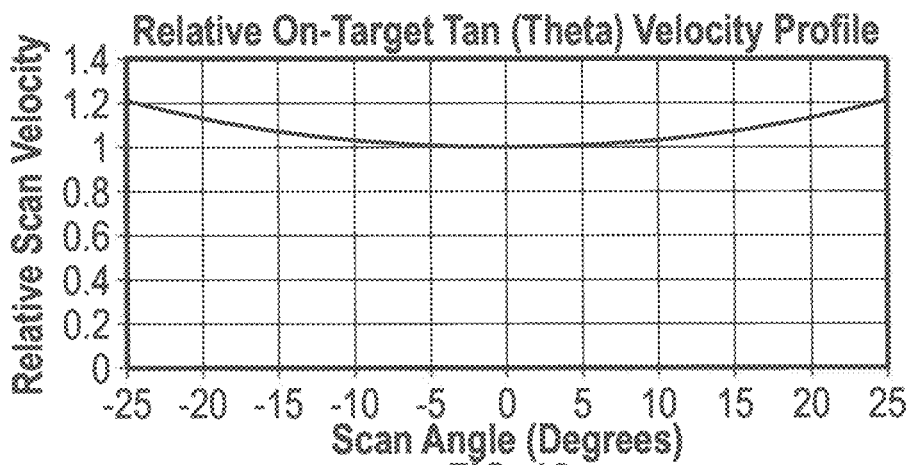
FIG. 16 illustrates a relative on-target theta velocity profile as a function of AOD's scan angle.
Figure 17:
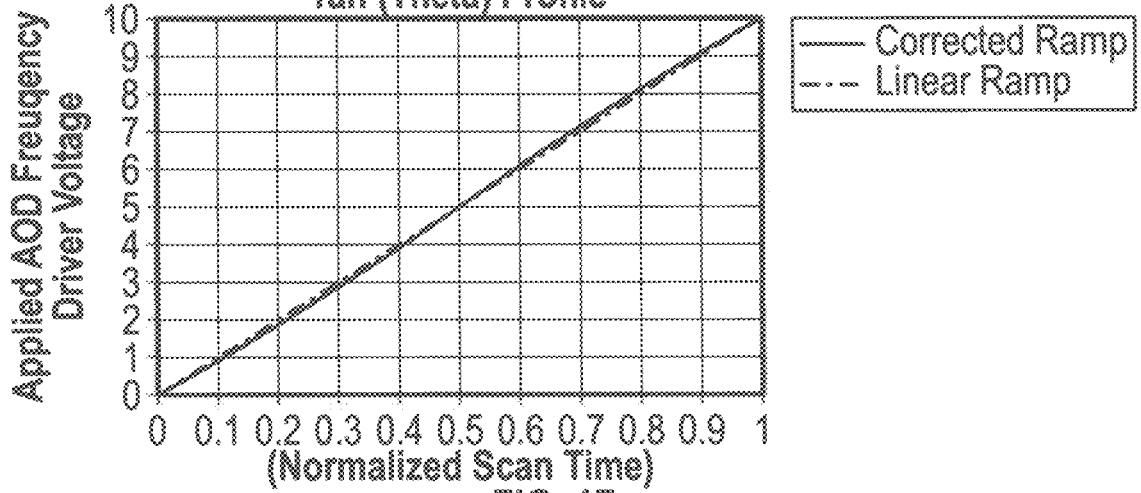
FIG. 17 illustrates an AOD frequency ramp to linear theta profile.
Figure 18:
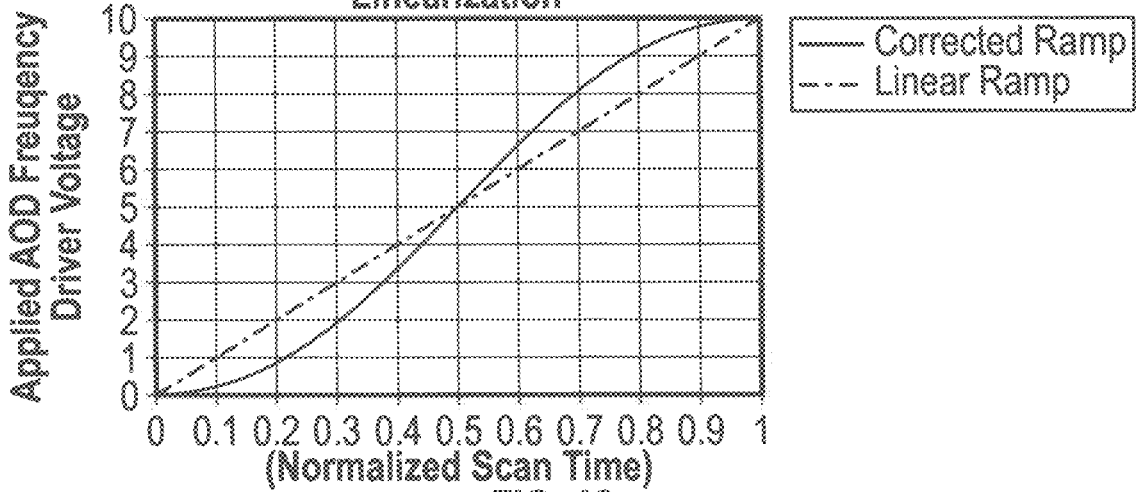
FIG. 18 illustrates theta velocity linearization.
Figure 19:
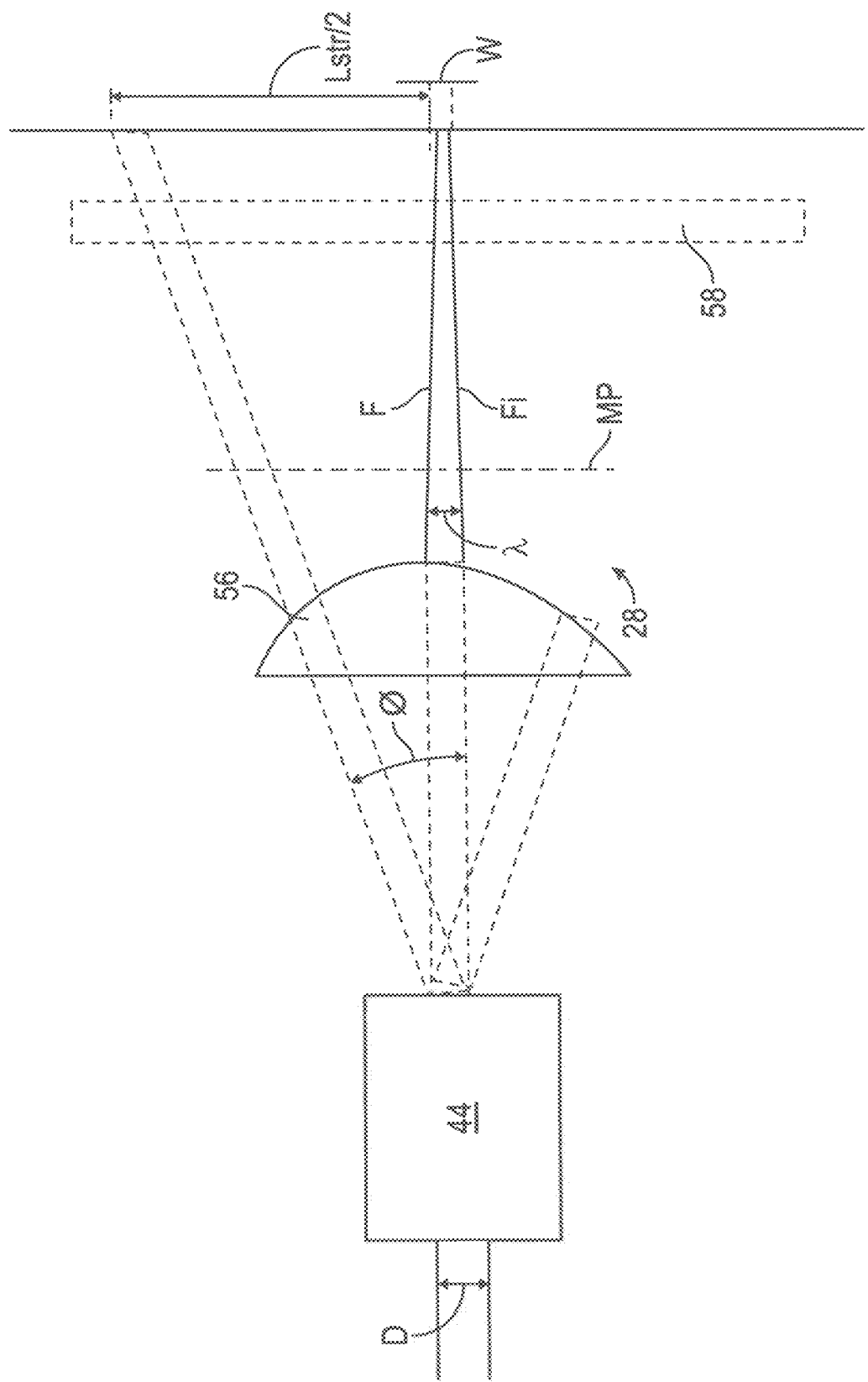
FIG. 19 illustrates the operational principle of the post-scan assembly in conjunction with the AOD.

FIG. 16 illustrates an example of the effect of a tan(theta) positional profile, with a linear RF driver frequency ramp (FIG. 17), along the length of the scanned line, with a corresponding velocity profile. Such a profile results in both exposure duration and fluence variations along the line. It is possible to compensate for the induced fluence variation by adjusting the modulation amplitude of the AOD RF driver, as disclosed above, but not the variation in exposure duration. Generating a constant velocity (constant exposure duration) requires implementing a non-linear ramp in the RF driver frequency, as illustrated in FIG. 18.

The post scan assembly 28 is operative to perform a variety of functions. It modifies scan angle and velocity from a scanner to the required values and optimizes the beam profile from the scanner for optional mask plane and/or objective lens matching. The post-scan assembly 28 can also modify chief ray angles into an optional mask plane and objective lens from across the full scanner angle range. A mask/object plane may be defined by: using an imaging objective, such as anamorphic F-theta and cylindrical lens, in either axis or both axes, cropping the beam at the mask plane in either axis or both axes, and using an anamorphic objective that may require different object planes for each axis. Occasionally, it may be necessary to provide further beam polarization adjustment. Also, the beam profile re-apodization may be implemented in the cross-scan axis.

Figure 21B:
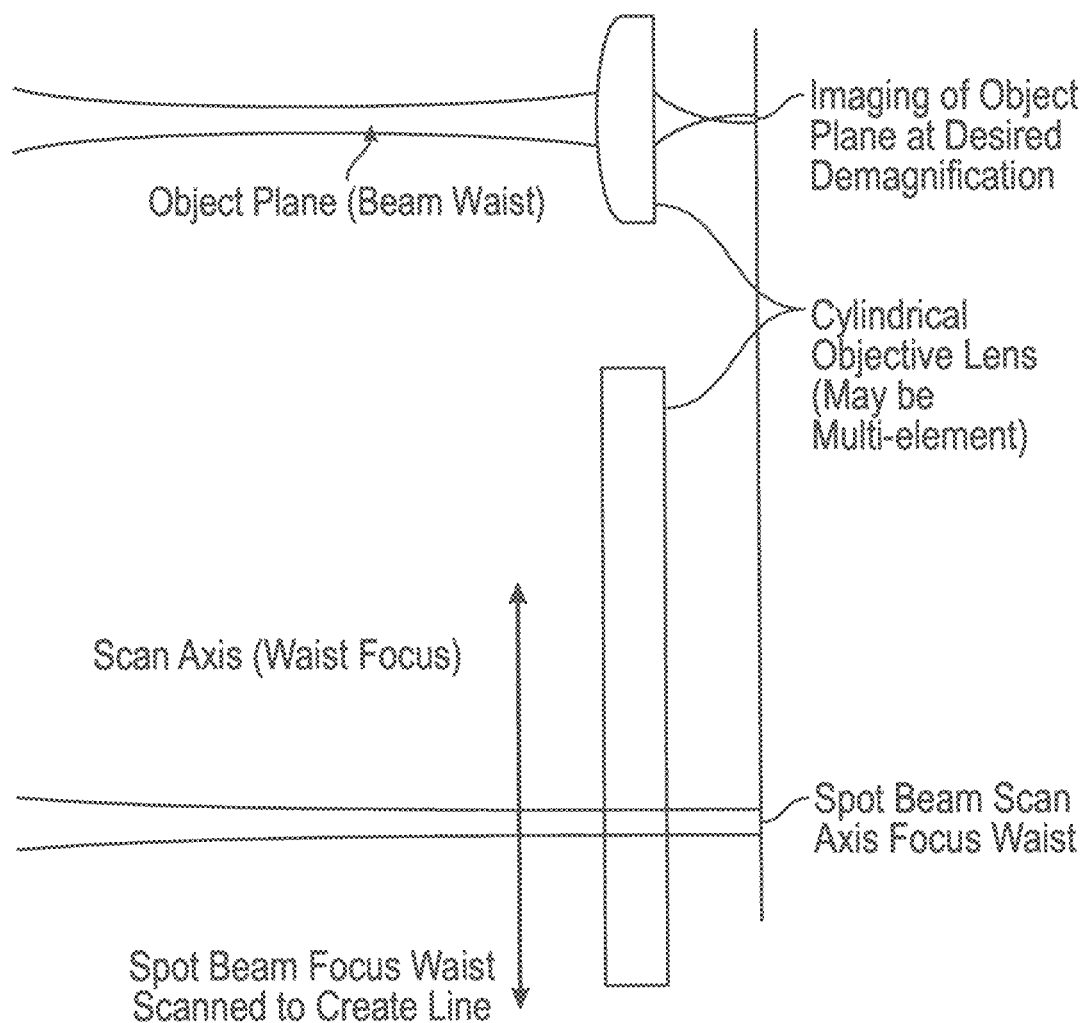

FIGS. 19, 20, 21A, and 21B illustrate the operation of post-scan assembly 28 used in combination with AOD 44 and operate to adjust the length and width of the beam of a diameter D upon impacting the AOD, which defines a scan angle $\varnothing$. The post-scan assembly 28 includes a cylindrical or spherical F-theta lens 56 or a combination of lenses with a focal length F. The spot is formed in the image plane, which is, in this case, the surface to be treated. The spot length is the product of $\lambda/\pi * F/2D$, where $\lambda$ is the laser beam wavelength. The length of the stripe $L_{scan}$ is determined as $2F*\tan \varnothing$ which means that the longer the focal length, the longer the stripe's length $L_{scan}$. In summary, the scan angle and focal length F define the length of the stripe $L_{scan}$. Based on the above, if the stripe length $L_{scan}$ is increased in response to the increased focal length F, the scanning velocity should be increased to maintain the same (given) exposure duration. Thus, the output power of a laser should be increased in order to obtain the predetermined fluence with the increased scanning velocity. Overall, as the laser power is increased, it is possible to increase the focal length to get a longer line. However, the increased focal length obviously necessitates a greater footprint of the entire apparatus. To keep the footprint of the apparatus in check while forming long stripes, two different layouts can be used. One is the use of mask MP. The other way is to use lens 56 operating as an F-theta lens for adjusting the spot length in the scan axis, and use a cylindrical lens or lenses for adjusting the spot width in the cross-scan axis, as illustrated in FIG. 21B.

FIG. 21A illustrates an exemplary schematic of post scan assembly 28 including a combination of diverging and converging lenses. The AOD 44 receives a beam, which is collimated in the scan axis/direction, and deflects it at an angle θ with a beam diameter D. Then the deflected beam is incident on an upstream diverging lens 48 and further on two converging lenses 50 and 52 to obtain the desired dimension of the spot beam in the scan direction. The illustrated configuration of post-scan assembly 28 allows forming sufficiently long lines without stitching, provided that AOD 44 is placed several meters from the objective lens and near a telecentric multi-element Galilean or Keplarian telescope, while controlling a spot size. The long lines in this schematic each may reach 1015 mm. It is possible to form even longer stripes with the increased laser power.

Figure 22:
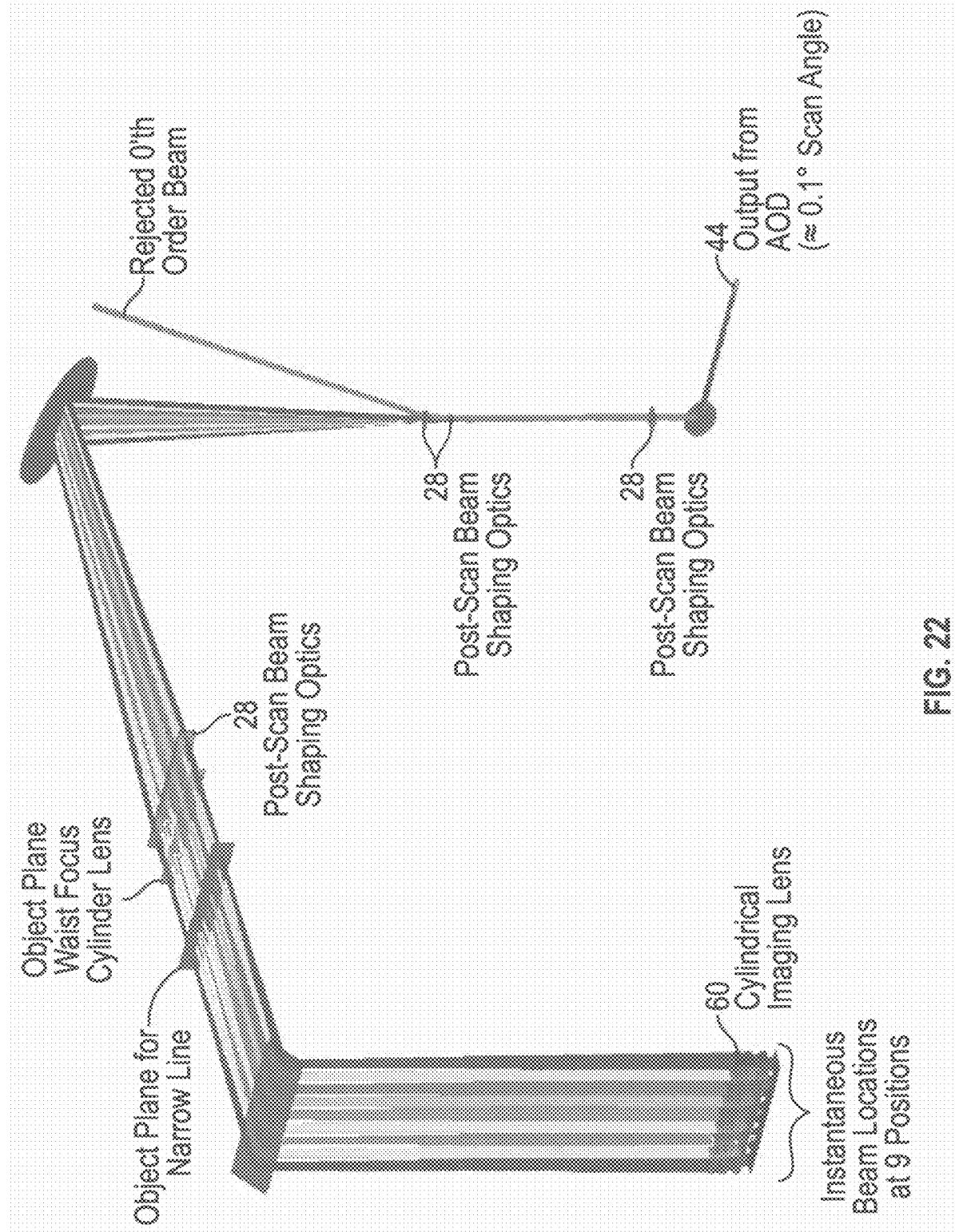
FIG. 22 is a schematic of possible implementations the AOD with an objective lens.

Referring to FIG. 22, a collimated beam impacts AOD 44 having approximately 2.5 mrad scan angle. The light propagates through a post-scan optical assembly 28 which scales the scan axis to the desired value in the object plane. Finally, a cylindrical imaging lens 60 scales the cross-scan axis of the spot.

There are several possible combinations of objective lens type and scan line focus type, each combination being compatible with different applications for obtaining the desired spot aspect ratio. All combinations can be used, as summarized below.

| Objective | Scan (line) axis | Narrow cross-scan axis | Application |
| --- | --- | --- | --- |
| Spherical F-theta | Waist focus | Waist focus | FLA like (large spot) |
| Anamorphic F-theta | Waist focus | Post F-theta re-focus | FLA like (large spot) |
| Spherical imaging | Imaging focus | Imaging focus | SLS or FLA like (narrow line) SiC Annealing/LLO |
| Anamorphic Imaging | Imaging focus | Imaging focus | SLS or FLA like (narrow line) SiC Annealing/LLO |
| Cylindrical imaging | Waist focus | Imaging focus | SLS or FLA like (narrow line) SiC Annealing/LLO |

Figures 23, 24:
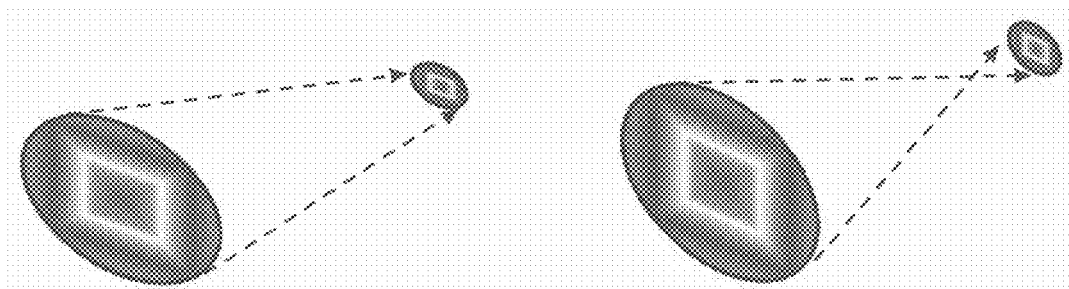
FIGS. 23-27 illustrate respective types of objective lens systems.

FIGS. 23 and 24 illustrate respective types of spherical objective lens types: a spherical F-theta with infinite conjugate at waist focus of FIG. 23 and spherical imaging lens with finite demagnification at the image plane, as illustrated in FIG. 24.

The F-theta lens of FIG. 23 is most compatible with the polygon type scanner, but can be used with AOD while readily generating long lines if telecentricity is not required. The spot beam size varies directly with laser beam size applied by the pre-scan optical system and divergence defined by the scanner. The spherical imaging lens of FIG. 24 is characterized by fixed demagnification and is not compatible with long, narrow line beams. The spot beam size is fixed with respect to object plane illumination.

Figures 25, 26:
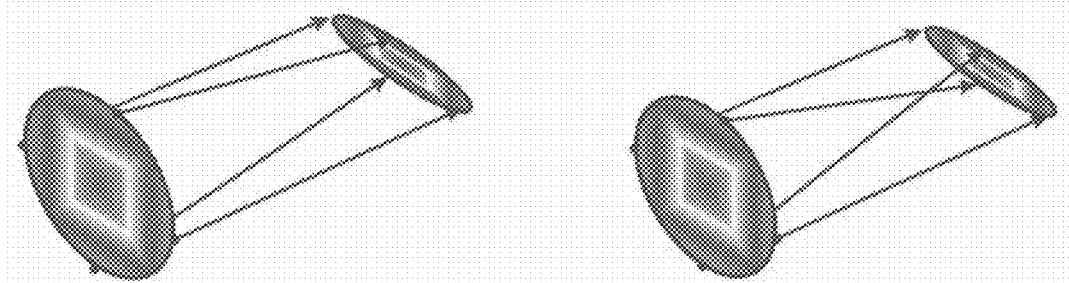
Figure 27:
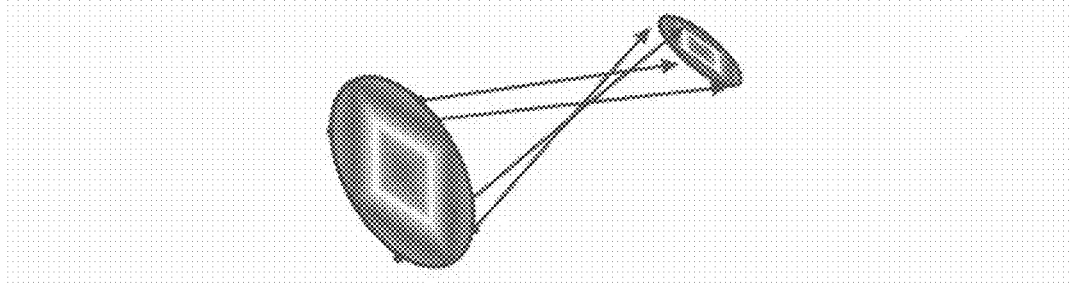
Figure 28A:
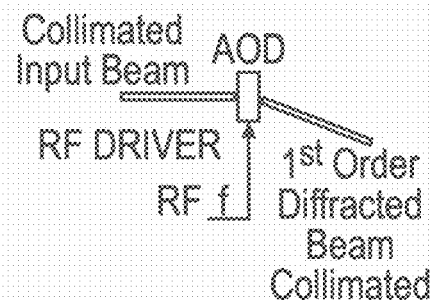
FIGS. 28A-28B illustrate the operation of the known AOD receiving a single RF-frequency input.
Figure 28B:
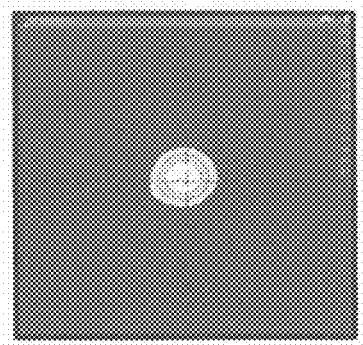

FIGS. 25-27 illustrate respective types of the anamorphic lens providing different focal lengths and/or focusing modes in each of the scan and cross-scan axes. There is a possibility that one axis might have no objective lens power, i.e., purely cylindrical objective.

FIG. 25 illustrates an anamorphic F-theta: infinite conjugate (waist focus). This configuration processes both scan and cross-scan axes, but with different focal lengths. FIG. 26 illustrates a cylindrical imaging lens: infinite conjugate on the scan axis and imaging focus on cross-scan axis. FIG. 27 illustrates an anamorphic imaging lens which is operative to image both short and long/scan axes, but with different demagnification factors.

Referring to FIGS. 28-31, the AOD may be used for shaping the beam profile in the cross-scan axis by introducing multiple frequencies. As known, with a single RF frequency launched into the AOD, the diffracted beam is a duplicate of the collimated incident beam (FIG. 28A) and has a beam shape in the cross-scan axis shown in FIG. 28B. To adjust the divergence of the diffracted beam, according to at least one embodiment a plurality of frequencies can be launched into the AOD, as shown in FIG. 29A, and held constant for the duration that the laser outputs light. This will result in the beam spreading, as shown in FIG. 29B, according to the $f_1 \ldots f_n$ frequencies launched.

Figure 29A:
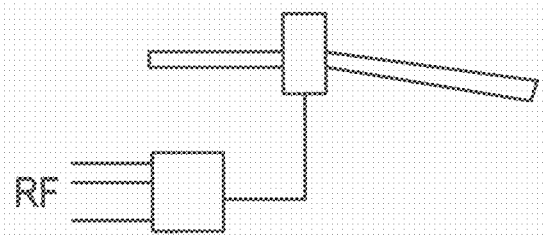
FIG. 29A and FIG. 29B illustrate the operation of the inventive AOD simultaneously receiving multiple RF frequency inputs to adjust the intensity profile in a cross-scan plane.
Figure 29B:
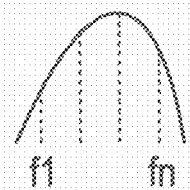
Figure 30A:
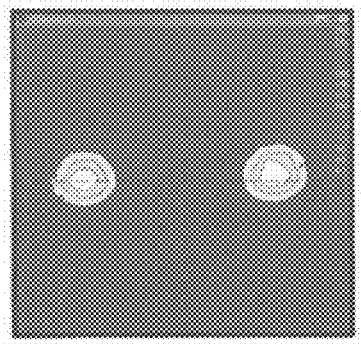
FIGS. 30A-30B and FIG. 31 illustrate respective computer shots using the AOD of FIGS. 29A and 29B for adjusting the desired beam profile in the cross-scan plane.
Figure 30B:
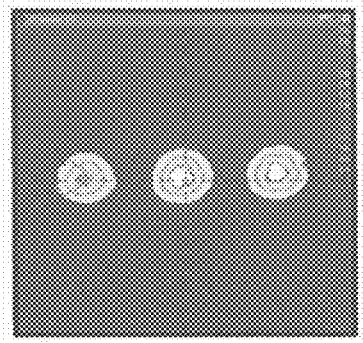
Figure 31:
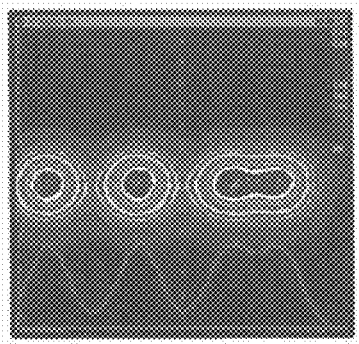

FIGS. 30A and 30B illustrate the inventive concept of FIGS. 29A and 29B. In response to multiple RF frequencies with respective varying amplitudes or a frequency spectrum simultaneously launched into AOD 44, the beam will spread or increase divergence in the diffraction cross-scan plane. FIG. 30A illustrates two beams at respective frequncies spaced far apart. FIG. 30B shows a three-beam output from AGOD 44 with respective frequencies spaced closer to one another than those of FIG. 30A. FIG. 31 illustrates a 4-RF frequency input selected so that one pair of adjacent beams are spaced apart while the other pair of beams practically overlap one another. In summary, the frequency amplitudes can be adjusted to maintain a gaussian distribution or change the latter to any desirable shape, such as super-Gaussian or preferably flat-top distribution if the freqencies are selected with specifically tailored amplitudes.

Figure 32:
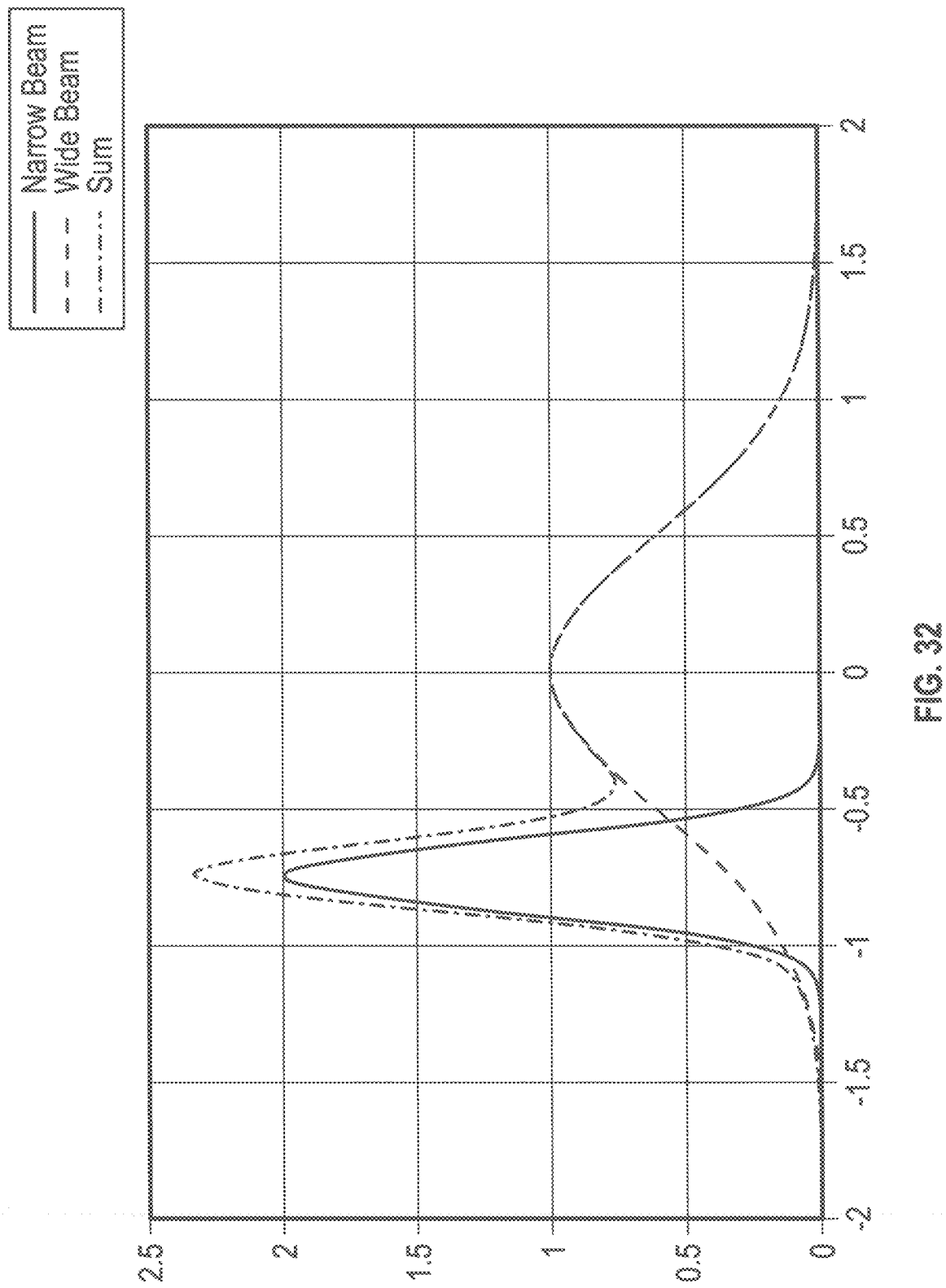
FIG. 32 illustrates a technique for adjusting the desired beam profile in a scan plane.

In reference to FIG. 32, the distribution profile in the scan axis can be adjusted, too. The standard ELA process has been optimized for use with a typical excimer laser beam intensity temporal profile: a short duration, high intensity spike, followed by a longer duration, lower intensity tail. This temporal profile allows the initial spike to cause melting of the Si film, while the tail portion allows controlled cooling and crystallization of the melted film. Because the typical fiber laser beam has a Gaussian profile, the scanning method of this invention results in an equivalent Gaussian temporal profile. While both SLS and FLA crystallization can be achieved with this Gaussian temporal prolife, it may be preferable to implement a temporal profile similar to that of an excimer laser.

One method to achieve such a temporal profile is to overlap two, or more, separate Gaussian beams such that the spatial offset between the beams, and the dimensions and powers of the individual beams create a temporal profile that may be adjusted for an optimized annealing process. The beams may be generated by multiple lasers, by splitting the beam of a single laser, or by multiple lasers with split beams.

The example shown in FIG. 32 illustrates spatial/temporal profile for combining two Gaussian beams with different dimensions and peak powers.

Those skilled in the art will recognize or be able to ascertain using no more than routine experimentation many equivalents to the specific embodiments of the invention described herein. The disclosed schematics can be used with any light imaging system, but the impetus for the presently disclosed structure lies herein. It is therefore to be understood that the foregoing embodiments are presented by way of example only and that within the scope of the appended claims and equivalents thereto; the invention may be practiced otherwise than as specifically described. The present disclosure is directed to each individual feature, system, material and/or method described herein. In addition, any combination of two or more such features, systems, materials and/or methods, if such features, systems, materials and/or methods are not mutually inconsistent, is included within the scope of the present invention.

The invention claimed is:

1. A method of processing an amorphous silicon (a-Si) film deposited on a glass panel, comprising:
    (a) outputting a beam at a desired power P along a pre-scan path from at least one quasi-continuous wave (QCW) fiber laser which operates at a desired duty cycle of at most 100%;
    (b) impinging the beam upon a scanner unit, thereby temporally chopping the beam into a plurality of sub-beams deviated off the pre-scan path within a desired angular range and at a desired angular velocity towards the a-Si film;
    (c) optically shaping each deviated sub-beam to provide a spot of light on the a-Si film having spot length $L_s$ and spot width $W_s$ and spatial intensity beam profile in the scanning direction;
    (d) sweeping the spot across the film in a scanning direction at a desired scanning velocity $V_{scan}$, thereby forming a stripe on the film of a predetermined length $L_{scan}$ and width $W_s$, wherein the scanning velocity and spatial beam profile generate controlled exposure duration at each location of the stripe and provide a desired fluence distribution in the scanning direction at each location within the stripe; and
    (e) continuously displacing the glass panel in a cross-scanning direction, thereby sequentially forming a plurality of consecutive scanned stripes spaced from one another direction at a distance dy, which is at most equal to spot width $W_s$, and together defining a column of polysilicon (p-Si) with a column width which corresponds to the length of the stripe $L_{scan}$.

2. The method of claim 1 further comprising repeating the steps (a) through (d) to further process the column of the p-Si film until a desired grain size and orientation of p-Si has been obtained, wherein the desired scanning velocity $V_{scan}$ and beam intensity profile are controlled so that a thermal reaction of each spot creates a completely melted triangularly-shaped film area with an apex which is spaced from the spot in a counter-scanning direction at a length $L_m$ at least 10 times greater than the width $W_s$, and the distance dy varies between 0.025Ws to Ws and increases within the range as a repetition rate of formation of the consecutive scanned stripes increases to prevent p-Si grains from degradation and physical destruction of the a-Si film due to feedback overheating.

3. The method of claim 2, further comprising:
    continuously displacing the glass panel in the cross-scanning direction at a distance dx at most equal to the column width $L_{scan}$ if the column width is smaller than that of the panel, during the formation of the column of p-Si at a panel velocity at m/s, and repeating steps (a) through (e), thereby forming at least one additional column of p-Si shifted off a previously formed adjacent column of p-Si by the distance dx, wherein the distance dy between adjacent stripes and distance dx between adjacent columns are selected such that each location of the processed film is irradiated in a range from 10 to 50 times, and repeating displacing the panel in the scanning direction and forming the columns, thereby forming the p-Si film over the entire panel, wherein the scanning velocity is maintained at km/sec, and the QCW fiber laser operates with the duty cycle less than 100% so as to output the beam at a pulse repetition frequency from 80 MHz, which is sufficient to generate a thermal response of the a-Si identical to that caused by the beam from the QCW fiber laser operating at 100% duty cycle.

4. The method of claim 3, wherein displacing the panel in the scanning direction at the distance dx of at most 0.5 mm precludes visible Mura, and the distances dy and dx are selected to be equal to one another or different from one another but the product dx*dy at each location is constant.

5. The method of claim 1, further comprising
providing at least one additional spot of light, such that the desired spatial intensity profiles is achieved in one of scanning, cross-scanning, or scanning and cross-scanning directions, and
shaping the sub-beams incident on the film so as to have a Gaussian, super-Gaussian, or flat-top intensity profile in the cross-scanning direction, wherein the Super-Gaussian power factor is bigger than 2.

6. The method of claim 1 further comprising shaping of the sub-beam in each of the scanning and cross-scanning directions, thereby having the desired spatial intensity profiles in respective scanning and cross-scanning directions.

7. The method of claim 1 further comprising controlling polarization of the sub-beam incident on the film, thereby controlling alignment of the polycrystalline grains such that the polarization of the sub-beam incident on the film is set perpendicular to the spot beam scanning direction, thereby controlling alignment of the polycrystalline grains.

8. The method of claim 1, wherein the beam is single mode or multimode in a ultraviolet (UV) wavelength range.

9. The method of claim 1, further comprising
calibrating the scanner unit which includes an acousto-optical deflector (AOD), a plurality of rotating mirrors coupled together to define a polygon, or the AOD and the polygon;
collimating the beam upstream from the AOD;
gating the QCW fiber laser by turning the AOD off and on such that the incidence of the beam on free-space areas between adjacent mirrors of the polygon is prevented, or such that the scanned stripe has a predetermined length $L_{scan}$ that is smaller than the maximum length of the stripe, with the maximum length being tens of centimeters;
adjusting a radio frequency (RF) at an input of the AOD for each mirror of the polygon, upon displacing the panel in the cross-scanning direction, thereby ensuring that the scanned stripes produced by respective mirrors are not shifted relative to one another;
measuring a focal depth of the sub-beam incident on the panel at a plurality of spaced-apart locations along the stripe length $L_{scan}$;
measuring a signal at each of the locations;
comparing the measured signal with a reference value to generate a comparison result; and
responsive to the comparison result, modulating an RF frequency at an input of the AOD so as to adjust a divergence of the sub-beam, thereby altering the focal depth.

10. The method of claim 9, further comprising generation of a plurality of RFs at the input of the AOD, and adjusting amplitudes of respective RFs to alter the divergence of sub-beams in the cross-scanning direction, thereby providing a desired intensity profile across the stripe, the intensity profile being selected from Gaussian, super-Gaussian or flat-top.

11. The method of claim 1, further comprising mounting deformable optics between the scanner unit and the panel such that a focus plane tracks the panel surface, the deformable optics including one or more deformable mirrors, each of which have a continuously variable radius of curvature along a length of the sub-beam and along a length of each mirror of the polygon to compensate for an unevenness of the panel surface.

12. An apparatus for processing a surface of a workpiece, comprising:
a QCW fiber laser operative to emit a laser beam at a constant power along a pre-scan path;
a pre-scan beam conditioner configured to shape the laser beam such that an instantaneous spot beam has predetermined geometrical dimensions, intensity profile, and power;
a scanner positioned downstream from the pre-scan beam conditioner configured to receive the laser beam and deflect it into a plurality of sub-beams deflected off the pre-scan path, wherein the scanner operates at a predetermined angular velocity and angular range;
a post-scan optical assembly configured to provide the spot beam with predetermined geometrical dimensions, power, angular velocity and range, spot dimensions and intensity profile being selected such that when the instantaneous spot beam is dragged in a linear scan direction at a desired scan velocity, a desired exposure duration and fluence within a scanned stripe is achieved; and
a multi-axis stage operating to displace the workpiece at least in a cross-scan direction to form a plurality of uniform stripes that at least partially overlap one another to define a column, wherein the desired scan velocity and fluence provide a desired quality of the surface comparable to that of the surface that is processed by an excimer laser or a burst-mode fiber laser.

13. The apparatus of claim 12, wherein the QCW fiber laser operates with a duty cycle of at most 100% outputting the laser beam in a single mode or multiple transverse modes, whereby when operated at a duty cycle below 100%, the QCW fiber laser outputs a train of nanosecond pulses at a regular pulse repetition frequency from 80 to 200 MHz, which generates a thermal response of the treated surface identical to that caused by the beam from the QCW fiber laser operated with a 100% duty cycle.

14. The apparatus of claim 12, wherein the pre-scan beam conditioner further includes:
a polarizer assembly configured to lower the constant power to the predetermined power; and
a collimator configured to shape the laser beam so that it to becomes parallel upstream from the scanner which includes an acousto-optical deflector (AOD).

15. The apparatus of claim 14, further comprising a power controller located downstream from the pre-scan beam conditioner and coupled to the polarizer so as to adjust the constant power if it deviates from the predetermined power.

16. The apparatus of claim 12, further comprising multiple QCW fiber lasers outputting respective laser beams incident on the pre-scan beam conditioner, which is configured with a beam combiner configured to output the laser beam having the desired intensity profile in the scan direction, cross-scan direction, or scan and cross-scan directions, wherein the desired intensity profile is selected from the group consisting of a Gaussian, super-Gaussian, flat top profile, and combinations of these profiles.

17. The apparatus of claim 12 wherein the scanner is configured as a polygon, AUOD, or a combination of AOD and polygon where the polygon is located downstream from the AOD, and all operate to generate a km/sec velocity at the workpiece, the AOD configured to:
   gate the QCW fiber laser in order to prevent the incidence of the laser beam on interstices between adjacent facets of the polygon, and
   alter the divergence angle so as to compensate for pointing errors of the facets of the polygon and unevenness of the surface to be treated, and
   including an RF generator configured to drive the AOD so as to control a divergence angle of the sub-beams deflected from the polygon and being operative to output a plurality of different frequencies into the AOD so as to control the spatial profile of the spot beam in the scan direction.

18. The apparatus of claim 12, wherein the post-scan optical assembly is configured with an objective lens selected from the group consisting of spherical, anamorphic, and a combination of spherical and anamorphic objective lenses,
   the anamorphic objective lens includes an anamorphic F-theta, cylinder, or anamorphic imaging lenses, the anamorphic imaging lens being configured with different magnification in scan and cross-scan directions,
   the spherical objective lens includes a spherical F-theta lens and the anamorphic objective lens includes a spherical imaging lens with fixed demagnification.

19. The apparatus of claim 18, wherein the post-scan optical assembly, including the spherical imaging lens, a cylindrical imaging lens and an anamorphic imaging lens, further includes one or more cylindrical lenses located downstream from the objective lens, which functions to adjust the spot beam in the cross-scan direction.

20. The apparatus of claim 12, wherein the multi-axis stage is configured to continuously move the workpiece in the cross-scan direction at a m/sec speed and over a distance dy not exceeding a full width of the stripe to form the column and operative to displace the workpiece in the scan direction at a distance dr at most equal to a width of the column, wherein the distances dy and dx are selected to be equal to one another or different from one another but the product dx*dy at each location is constant.

21. The apparatus of claim 20, wherein the distance between adjacent stripes in the cross-scan direction and distance between adjacent columns are selected such that each location of the processed surface is irradiated in a range from 10 to 40 times.

22. The apparatus of claim 12, further comprising deformable optics between the scanner and the workpiece configured to compensate for an unevenness of the surface.

* * * * *